US007800912B2

(12) United States Patent  
Nakamura et al.

(10) Patent No.: US 7,800,912 B2  
(45) Date of Patent: Sep. 21, 2010

(54) SIGNAL TRANSFER SYSTEM, SIGNAL OUTPUT CIRCUIT BOARD, SIGNAL RECEIVING CIRCUIT BOARD, SIGNAL OUTPUT METHOD, AND SIGNAL RECEIVING METHOD

(75) Inventors: Takayuki Nakamura, Tokyo (JP); Takashi Sekino, Tokyo (JP)

(73) Assignee: Advantest Corporation, Tokyo (JP)

( * ) Notice: Subject to any disclaimer, the term of this patent is extended or adjusted under 35 U.S.C. 154(b) by 1056 days.

(21) Appl. No.: 11/328,440

(22) Filed: Jan. 9, 2006

(65) Prior Publication Data

US 2006/0170517 A1    Aug. 3, 2006

Related U.S. Application Data

(63) Continuation of application No. PCT/JP2005/023824, filed on Dec. 26, 2005.

(30) Foreign Application Priority Data

Jan. 11, 2005    (JP) .............................. 2005-004481

(51) Int. Cl.  
*H05K 1/00* (2006.01)

(52) U.S. Cl. ...................... 361/748; 361/679; 333/177; 333/185; 333/204; 29/592.1; 29/846; 324/758; 324/247

(58) Field of Classification Search ................. 361/748, 361/679; 29/846, 592.1; 333/177, 185, 204; 324/758, 247

See application file for complete search history.

(56) References Cited

U.S. PATENT DOCUMENTS

| 3,594,506 A | * | 7/1971 | Bauer et al. .................... 73/646 |
| 3,956,717 A | * | 5/1976 | Fisher et al. ................. 333/121 |
| 4,104,946 A | * | 8/1978 | Peterson ...................... 84/697 |
| 4,232,298 A | * | 11/1980 | Ley ........................ 340/825.71 |
| 4,450,481 A | * | 5/1984 | Dickinson ................... 380/209 |
| 4,464,637 A | * | 8/1984 | Jablonski .................... 330/126 |
| 4,466,107 A | * | 8/1984 | Stoner ........................ 375/259 |
| 5,124,675 A | * | 6/1992 | Komazaki et al. ........... 333/204 |

(Continued)

FOREIGN PATENT DOCUMENTS

JP        49-130164        12/1974

(Continued)

OTHER PUBLICATIONS

International Search Report issued in International application No. PCT/JP2005/023824 mailed on Mar. 28, 2006 and partial English translation thereof, 10 pages.

(Continued)

*Primary Examiner*—Xiaoliang Chen  
(74) *Attorney, Agent, or Firm*—Osha • Liang LLP

(57) ABSTRACT

There is provided a signal transfer system that has a driver for outputting a signal, a transmission line for transmitting the signal, an insertion-type attenuator, inserted into the transmission line in series, for largely attenuating the low-frequency signal more than a high-frequency signal and an additional-type attenuator, inserted between the transmission line and a reference potential, for largely attenuating the low-frequency signal more than the high-frequency signal, and that matches composite impedance generated by the driver, the insertion-type attenuator and the additional-type attenuator with impedance of the transmission line.

8 Claims, 9 Drawing Sheets

U.S. PATENT DOCUMENTS

| | | | | |
|---|---|---|---|---|
| 5,170,493 | A * | 12/1992 | Roth | 455/82 |
| 5,204,904 | A * | 4/1993 | Carver et al. | 381/13 |
| 5,365,177 | A * | 11/1994 | Hamp et al. | 324/547 |
| 5,491,839 | A * | 2/1996 | Schotz | 455/39 |
| 5,502,421 | A * | 3/1996 | Nakahara | 333/81 R |
| 5,576,497 | A * | 11/1996 | Vignos et al. | 73/861.22 |
| 6,275,023 | B1 | 8/2001 | Oosaki et al. | |
| 6,327,678 | B1 * | 12/2001 | Nagai | 714/700 |
| 6,377,062 | B1 * | 4/2002 | Ramos et al. | 324/758 |
| 6,448,873 | B1 * | 9/2002 | Mostov | 333/185 |
| 6,529,102 | B2 * | 3/2003 | Masuda et al. | 333/177 |
| 6,567,941 | B1 * | 5/2003 | Turnquist et al. | 714/724 |
| 6,642,707 | B1 | 11/2003 | Iorga et al. | |
| 6,882,245 | B2 * | 4/2005 | Utsunomiya et al. | 333/174 |
| 7,129,487 | B2 * | 10/2006 | Hatatani et al. | 250/338.3 |
| 7,317,309 | B2 * | 1/2008 | Yamaguchi et al. | 324/76.19 |
| 7,417,424 | B2 * | 8/2008 | Desplats et al. | 324/247 |
| 2001/0019608 | A1 * | 9/2001 | Lofmark | 379/398 |
| 2004/0181731 | A1 * | 9/2004 | Rajsuman et al. | 714/747 |
| 2006/0133598 | A1 * | 6/2006 | Pagnanelli | 379/406.08 |

FOREIGN PATENT DOCUMENTS

| | | |
|---|---|---|
| JP | 1-94277 | 4/1989 |
| JP | 3-8781 | 1/1991 |
| JP | 4-294287 | 10/1992 |
| JP | 5-142301 | 6/1993 |
| JP | 5-312910 | 11/1993 |
| JP | 6-43580 | 6/1994 |
| JP | 8-288881 | 11/1996 |

OTHER PUBLICATIONS

Extended European Search Report for Application No. 05820391.0-2216, mailed on Jun. 25, 2010 (6 pages).

* cited by examiner

SIGNAL TRANSFER SYSTEM, SIGNAL OUTPUT CIRCUIT BOARD, SIGNAL RECEIVING CIRCUIT BOARD, SIGNAL OUTPUT METHOD, AND SIGNAL RECEIVING METHOD

BACKGROUND OF THE INVENTION

1. Field of the Invention

The present invention relates to a signal transfer system, a signal outputting circuit board, a signal receiving circuit board, a signal outputting method and a signal receiving method. More specifically, the invention relates to a signal transfer system for transmitting a signal, a signal outputting circuit board and a signal outputting method for sending out a signal to the outside and a signal receiving circuit board and a signal receiving method for receiving a signal from the outside.

The present application relates to Japanese Patent Application No. 2005-004481 filed on Jan. 11, 2005. The contents described therein will be incorporated in the present application as part of description of the present application.

2. Related Art

A high-frequency signal attenuates largely as compared to a low-frequency signal depending on frequency characteristics of a transmission line in transmitting a high-speed signal by using the transmission line such as a cable and signal lines on a board in general. This is a big problem in a test apparatus and a measuring system of semiconductor devices. Then, conventionally, there has been used a method of reducing the difference of attenuation level of high and low-frequency signals by providing a peaking circuit that largely attenuates a low-frequency signal more than a high-frequency signal on a signal transmission line.

However, because impedance of the peaking circuit that is used to largely attenuate the low-frequency signal more than the high-frequency signal varies as frequency of a signal to be transmitted becomes high, it has been difficult to match the impedance in the transmission line.

A need for transmitting a high frequency signal is increasing lately in a signal transfer system of the test apparatus and measuring system of semiconductor devices. However, even though the difference of attenuation level of the high and low-frequency signals is reduced in the signal transfer system in which the peaking circuit is provided in its transmission line as described above, it is posing a big problem because the higher the frequency, the more remarkable the mismatch of impedance becomes, thus increasing a signal loss.

SUMMARY OF THE INVENTION

Accordingly, it is an object of the invention to provide a signal transfer system, a signal outputting circuit board, a signal receiving circuit board, a signal outputting method and a signal receiving method which are capable of solving the above-mentioned problem. This object may be achieved through the combination of features described in independent claims of the invention. Dependent claims thereof specify preferable embodiments of the invention.

According to a first aspect of the invention, a signal transfer system has a driver for outputting a signal, a transmission line for transmitting the signal, an insertion-type attenuator, inserted into the transmission line in series, for largely attenuating the low-frequency signal more than a high-frequency signal and an additional-type attenuator, inserted between the transmission line and a reference potential, for largely attenuating the low-frequency signal more than the high-frequency signal, and matches composite impedance generated by the driver, the insertion-type attenuator and the additional-type attenuator with impedance of the transmission line.

The signal transfer system may further include a reference potential supplying section capable of varying a center level of the signal as the reference potential. The insertion-type attenuator may be provided in the vicinity of the driver on the transmission line and the additional-type attenuator is provided between the driver and the insertion-type attenuator. The signal transfer system may further include a receiving section for receiving the signal transmitted through the transmission line, the insertion-type attenuator may be provided in the vicinity of the receiving section on the transmission line and the additional-type attenuator may be provided between the receiving section and the insertion-type attenuator. The signal transfer system may further include a reference voltage supplying section that is capable of varying terminal voltage of the receiving section.

The signal transfer system may further include a receiving section for receiving the signal transmitted through the transmission line, the insertion-type attenuator may be provided in the vicinity of the receiving section on the transmission line and the additional-type attenuator may be provided between the receiving section and the insertion-type attenuator. The driver may be provided in a pin card for driving a test signal in a test apparatus for testing semiconductor devices and the receiving section may be provided in a performance board having a contact terminal that contacts with the semiconductor device. The receiving section may be the semiconductor device.

The signal transfer system may further include a bypassing switch for bypassing the insertion-type attenuator. The signal transfer system may be provided with a plurality of insertion-type attenuators which attenuate a low-frequency signal differently in parallel and may further include an insertion-type attenuator selecting switch for selecting part of the insertion-type attenuators within the plurality of insertion-type attenuators. The signal transfer system may further include a disconnecting switch for disconnecting the additional-type attenuators from the transmission line. The signal transfer system may be provided with a plurality of additional-type attenuators which attenuate a low-frequency signal differently in series and may further include an additional-type attenuator selecting switch for selecting part of the additional-type attenuators within the plurality of additional-type attenuators and bypassing the other additional-type attenuators.

According to a second aspect of the invention, a signal outputting circuit board for sending out a signal to the outside includes a driver for outputting the signal, a connector for sending out the signal to the outside, an insertion-type attenuator, inserted between the driver and the connector in series, for largely attenuating the low-frequency signal more than a high-frequency signal, a bypassing switch for bypassing the insertion-type attenuator, a measuring section for measuring an attenuation level of the high-frequency signal in a transmission path from the driver to a signal receiving circuit board when the signal receiving circuit board that receives the signal is connected with the signal outputting circuit board via the connector and a switch control section for turning on the bypassing switch when the attenuation level is smaller than a reference value.

A plurality of insertion-type attenuators which attenuate a low-frequency signal differently may be provided in parallel between the driver and the connector, the signal outputting circuit board may further include an insertion-type attenuator selecting switch for selecting part of the insertion-type attenuators within the plurality of insertion-type attenuators and the switch control section may cause the insertion-type attenuator selecting switch to select the part of insertion-type attenuators within the plurality of insertion-type attenuators based on the attenuation level measured by the measuring section.

According to a third aspect of the invention, a signal receiving circuit board for receiving a signal from the outside includes a connector for receiving the signal from the outside, a receiver for receiving the signal via the connector, a signal line for transmitting the signal from the connector to the receiver, an additional-type attenuator that connects the signal line with the reference potential and largely attenuates a low-frequency signal more than a high-frequency signal, a disconnecting switch for disconnecting the additional-type attenuator, a measuring section for measuring an attenuation level of the high-frequency signal in a transmission path from the signal outputting circuit board to the receiver when the signal outputting circuit board for sending out the signal is connected with the signal receiving circuit board via the connector and a switch control section for disconnecting the additional-type attenuator by the disconnecting switch when the attenuation level is smaller than a reference value.

A plurality of additional-type attenuators which attenuate a low-frequency signal differently may be provided in series between the connector and the receiver, the signal receiving circuit board may further include an additional-type attenuator selecting switch for selecting part of the additional-type attenuators within the plurality of additional-type attenuators and bypassing the other additional-type attenuators and the switch control section may cause the additional-type attenuator selecting switch to select the part of the additional-type attenuators within the plurality of additional-type attenuators based on the attenuation level measured by the measuring section.

According to a fourth aspect of the invention, a signal outputting method for sending out a signal to the outside by using a signal outputting circuit board includes a step of outputting the signal by a driver, a step of sending out the signal to the outside through a connector, a step of attenuating a low-frequency signal more than a high-frequency signal by an insertion-type attenuator inserted between the driver and the connector in series, a step of bypassing the insertion-type attenuator by a bypassing switch, a step of measuring an attenuation level of the high-frequency signal in a transmission path from the driver to a signal receiving circuit board when the signal receiving circuit board that receives the signal is connected with the signal outputting circuit board via the connector and a switch controlling step of turning on the bypassing switch when the attenuation level is smaller than a reference value.

A plurality of insertion-type attenuators which attenuate a low-frequency signal differently may be provided in parallel between the driver and the connector in the signal outputting circuit board, the signal outputting method may further include a selection step of selecting a part of the insertion-type attenuators within the plurality of insertion-type attenuators by an insertion-type attenuator selecting switch and the insertion-type attenuator selecting switch may be caused to select the part of insertion-type attenuators within the plurality of insertion-type attenuators based on the attenuation level measured by the measuring step in the switch control step.

According to a fifth aspect of the invention, a signal receiving method for receiving a signal from the outside by using a signal receiving circuit board includes a step of receiving the signal from the outside through a connector, a step of receiving the signal by a receiver via the connector, a step of transmitting the signal from the connector to the receiver through a signal line, an attenuating step of attenuating a low-frequency signal more than a high-frequency signal by an additional-type attenuator that connects the signal line with the reference potential, a step of disconnecting the additional-type attenuator by a disconnecting switch, a step of measuring an attenuation level of the high-frequency signal in a transmission path from the signal outputting circuit board to the receiver when the signal outputting circuit board for sending out the signal is connected with the signal receiving circuit board via the connector and a switch control step of disconnecting the additional-type attenuator by the disconnecting switch when the attenuation level is smaller than a reference value.

A plurality of additional-type attenuators which attenuate a low-frequency signal differently is provided in series between the connector and the receiver in the signal outputting circuit board and the signal receiving method may further include a step of selecting part of the additional-type attenuators within the plurality of additional-type attenuators by an additional-type attenuator selecting switch and bypassing the other additional-type attenuators, and the additional-type attenuator selecting switch may be caused to select the part of the additional-type attenuators within the plurality of additional-type attenuators based on the attenuation level measured by the measuring section in the switch control step.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
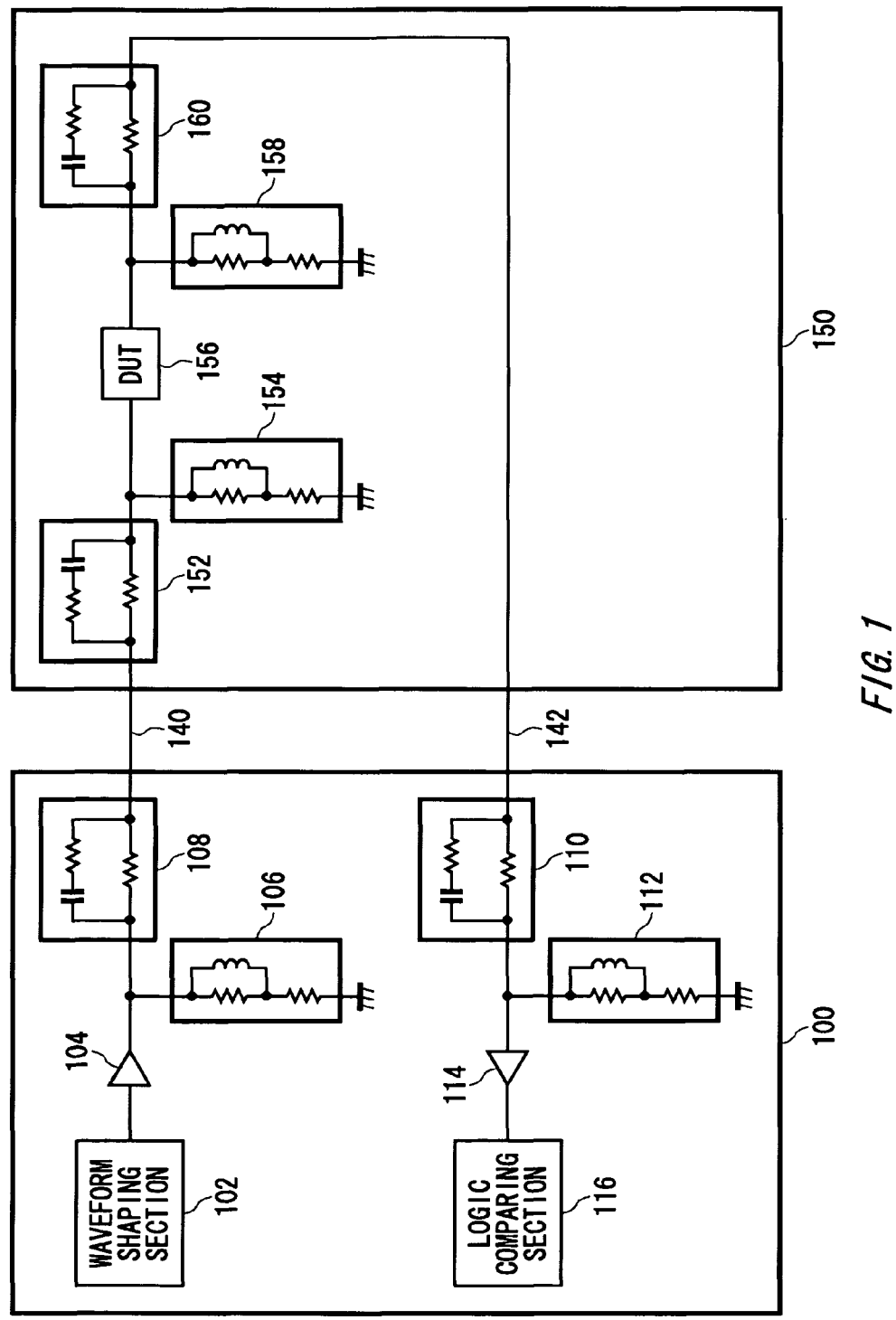
FIG. 1 is a block diagram showing one exemplary configuration of a signal transfer system according to a first embodiment of the invention.

FIG. 1 is a block diagram showing one exemplary configuration of a signal transfer system 10 according to a first embodiment of the invention. The signal transfer system 10 transmits a test signal to be fed to a DUT (Device Under Test) 156 in a test apparatus for testing semiconductor devices. The signal transfer system 10 has a pin card 100 provided for each of a plurality of terminals of the DUT 156 and a performance board 150 connected to the pin card 100 via transmission lines 140 and 142. The transmission lines 140 and 142 may be at least either one of a cable for connecting the pin card 100 with the performance board 150 and a signal line on the board in each of the pin card 100 and the performance board 150.

An object of the signal transfer system 10 of the first embodiment of the invention is to correct a loss of signals to be transmitted by reducing a difference of attenuation level of high and low frequency signals and by matching impedance in the transmission lines 140 and 142 when the high-frequency signal attenuates largely as compared to the low-frequency signal when the transmission lines 140 and 142 for transmitting the signal are long or when a high frequency signal is transmitted.

The pin card 100 has a waveform shaping section 102, a driver 104, an additional attenuator 106, an insertion attenuator 108, an additional-type attenuator 112, a comparator 114 and a logic comparing section 116. It drives the test signal to be fed to the DUT 156 and compares an output signal outputted out of the DUT 156 in correspondence to the test signal with an expected value. The waveform shaping section 102 shapes waveform of the test signal to be fed to the DUT 156 and outputs it to the driver 104. The driver 104 outputs the test signal received from the waveform shaping section 102 to the performance board 150 via the transmission line 140. The additional-type attenuator 106 is connected between the transmission line 140 and a reference potential and largely attenuates the low-frequency signal more than the high-frequency signal. Here, the high and low frequency signals may be high and low frequency components of the test signal. The additional-type attenuator 106 may be also provided between the driver 104 and the insertion-type attenuator 108. It is noted that the additional-type attenuator 106 presents different impedance depending on frequency of the test signal to be transmitted. Specifically, the additional-type attenuator 106 presents higher impedance as the frequency of the test signal increases. The insertion-type attenuator 108 is inserted into the transmission line 140 in series and largely attenuates the low-frequency signal more than the high-frequency signal. Here, the insertion-type attenuator 108 may be provided in the vicinity of the driver 104 on the transmission line 140. It is noted that the insertion-type attenuator 108 presents different impedance depending on the frequency of the test signal to be transmitted. Specifically, differing from the additional-type attenuator 106, the insertion-type attenuator 108 presents lower impedance as the frequency of the test signal increases.

The performance board 150 has an insertion-type attenuator 152, an additional-type attenuator 154, the DUT 156, an additional-type attenuator 158 and an insertion-type attenuator 160. The performance board 150 is also provided with a contact terminal that contacts with the DUT 156. The performance board 150 receives the test signal outputted out of the driver 104 and feeds the received signal to the DUT 156 via the contact terminal. Still more, the performance board 150 receives the output signal outputted out of the DUT 156 via the contact terminal and transmits the received signal to the comparator 114. It is noted that the DUT 156 is one example of a receiving section of the invention. The insertion-type attenuator 152 is inserted into the transmission line 140 in series and largely attenuates the high-frequency signal more than the low-frequency signal. Here, the insertion-type attenuator 152 may be provided in the vicinity of the receiving section 156 on the transmission line 140. It is noted that the insertion-type attenuator 152 presents lower impedance as the frequency of the test signal increases. The additional-type attenuator 154 is connected between the transmission line 140 and a reference potential and largely attenuates the high-frequency signal more than the low-frequency signal. Here, the additional-type attenuator 154 may be provided between the receiving section 156 and the insertion-type attenuator 152. It is noted that differing from the insertion-type attenuator 152, the additional-type attenuator 154 presents higher impedance as the frequency of the test signal increases. The receiving section 156 receives the test signal outputted out of the driver 104 and transmitted through the transmission line 140. Then, the receiving section 156 feeds the test signal to the DUT 156 via the contact terminal provided in the performance board 150.

In the signal transfer system 10 described above, composite impedance generated by the driver 104, the additional-type attenuator 106 and the insertion-type attenuator 108 is matched so as to be substantially equalized with impedance of the transmission line 140, e.g., 50Ω. Still more, composite impedance generated by the insertion-type attenuator 152, the additional-type attenuator 154 and the DUT 156 is matched so as to be substantially equalized with the impedance of the transmission line 140.

While a case of transmitting the test signal to be fed to the DUT 156 has been explained above, a case of transmitting the output signal of the DUT 156 will be explained next. The DUT 156 outputs the output signal generated in correspondence to the test signal to the comparator 114 via the transmission line 142. The additional-type attenuator 158 is connected between the transmission line 142 and the reference potential and largely attenuates the low-frequency signal more than the high-frequency signal. Here, the additional-type attenuator 158 may be provided between the DUT 156 and the insertion-type attenuator 160. It is noted that the additional-type attenuator 158 presents higher impedance as the frequency of the output signal increases. The insertion-type attenuator 160 is inserted into the transmission line 142 in series and largely attenuates the low-frequency signal more than the high-frequency signal. Here, the insertion-type attenuator 160 may be provided in the vicinity of the DUT 156 on the transmission line 142. It is noted that differing from the additional-type attenuator 158, the insertion-type attenuator 160 presents lower impedance as the frequency of the output signal increases.

The insertion-type attenuator 110 is inserted into the transmission line 142 in series and largely attenuates the high-frequency signal more than the low-frequency signal. Here, the insertion-type attenuator 110 may be provided in the vicinity of the comparator 114 on the transmission line 142. It is noted that the insertion-type attenuator 110 presents lower impedance as the frequency of the output signal increases. The additional-type attenuator 112 is connected between the transmission line 142 and the reference potential and largely attenuates the high-frequency signal more than the low-frequency signal. Here, the additional-type attenuator 112 may be provided between the comparator 114 and the insertion-type attenuator 110. It is noted that differing from the insertion-type attenuator 110, the additional-type attenuator 112 presents higher impedance as the frequency of the output signal increases. The comparator 114 receives the output signal outputted out of the DUT 156 and transmitted through the transmission line 142. Then, the comparator 114 compares the received output signal with reference voltage and outputs a comparison result to the logic comparing section 116. When the comparison result of the output signal with the reference voltage received from the comparator 114 coincides with a reference value set in advance, the logic comparing section 116 judges that the DUT 156 is non-defective.

In the signal transfer system 10 described above, the composite impedance generated by the DUT 156, the additional-type attenuator 158 and the insertion-type attenuator 160 is matched so as to be substantially equalized with the impedance of the transmission line 142. Still more, the composite impedance generated by the insertion-type attenuator 110, the additional-type attenuator 112 and the comparator 114 is matched so as to be substantially equalized with the impedance of the transmission line 142.

Thus, the signal transfer system 10 of the first embodiment of the invention is capable of reducing the difference of attenuation levels of the high and low frequency signals and of matching the impedance in the transmission lines 140 and 142 when the transmission lines are long or when a high frequency signal is transmitted by providing the insertion-type attenuators whose impedance decreases as the frequency increases and the additional-type attenuators whose impedance increases as the frequency increases in one and same transmission line. For example, it becomes possible to feed a high quality test signal to the semiconductor device and to judge whether or not the semiconductor device is defective based on a high quality output signal by reducing the difference of attenuation levels of the high and low frequency signals and by matching the impedance in the signal transmission in testing the semiconductor device by using the high frequency signal in the test apparatus for testing semiconductor devices.

It is also possible to lower the signal loss between the driver 104, the additional-type attenuator 106 and the insertion-type attenuator 108 by providing them closely from each other. Still more, it is possible to lower the signal loss in the same manner among the insertion-type attenuator 152, the additional-type attenuator 154 and the DUT 156, among the DUT 156, the additional-type attenuator 158 and the insertion-type attenuator 160 and among the insertion-type attenuator 110, the additional-type attenuator 112 and the comparator 114, respectively, by providing them closely from each other. It allows the impedance in the transmission line 140 and the transmission line 142 to be matched at high precision.

It is noted that the configuration of the signal transfer system 10 is not limited to that shown in FIG. 1 and may be modified variously from the configuration shown in FIG. 1. For example, the signal transfer system 10 may lack at least part of sets among the sets of the additional-type attenuator 106 and the insertion-type attenuator 108, of the insertion-type attenuator 152 and the additional-type attenuator 154, of the additional-type attenuator 158 and the insertion-type attenuator 160 and of the insertion-type attenuator 110 and the additional-type attenuator 112. That is, it is not necessary for the signal transfer system 10 to have the set of the insertion-type attenuator and the additional-type attenuator at least on one side of the pin card 100 and the performance board 150 in each of the transmission line 140 for transmitting the test signal and the transmission line 142 for transmitting the output signal. However, the difference of attenuation levels of the high and low frequency signals may be reduced more when the pin card 100 and the performance board 150 have the set of the insertion-type attenuator and the additional-type attenuator as compared to a case when only either one has the set of the insertion-type attenuator and the additional-type attenuator.

As for the disposition of the insertion-type attenuator and the additional-type attenuator in each set of the insertion-type attenuator and the additional-type attenuator, each additional-type attenuator is provided in the vicinity of the driver 104, the DUT 156 or the comparator 114 as explained in connection with FIG. 1. It allows reflection of the signals in the transmission lines 140 and 142 to be lowered. However, the disposition of the insertion-type attenuator and the additional-type attenuator may be reversed from the disposition shown in FIG. 1. Specifically, the insertion-type attenuator 108 may be provided between the driver 104 and the additional-type attenuator 106. However, it is preferable to provide the driver 104, the additional-type attenuator 106 and the insertion-type attenuator 108 closely from each other also in this case. The attenuators may be provided reversely from the disposition shown in FIG. 1 in the same manner also in the set of the insertion-type attenuator 152 and the additional-type attenuator 154, the set of the additional-type attenuator 158 and the insertion-type attenuator 160 and the set of the insertion-type attenuator 110 and the additional-type attenuator 112 in the pin card 100 or the performance board 150.

Figure 2:
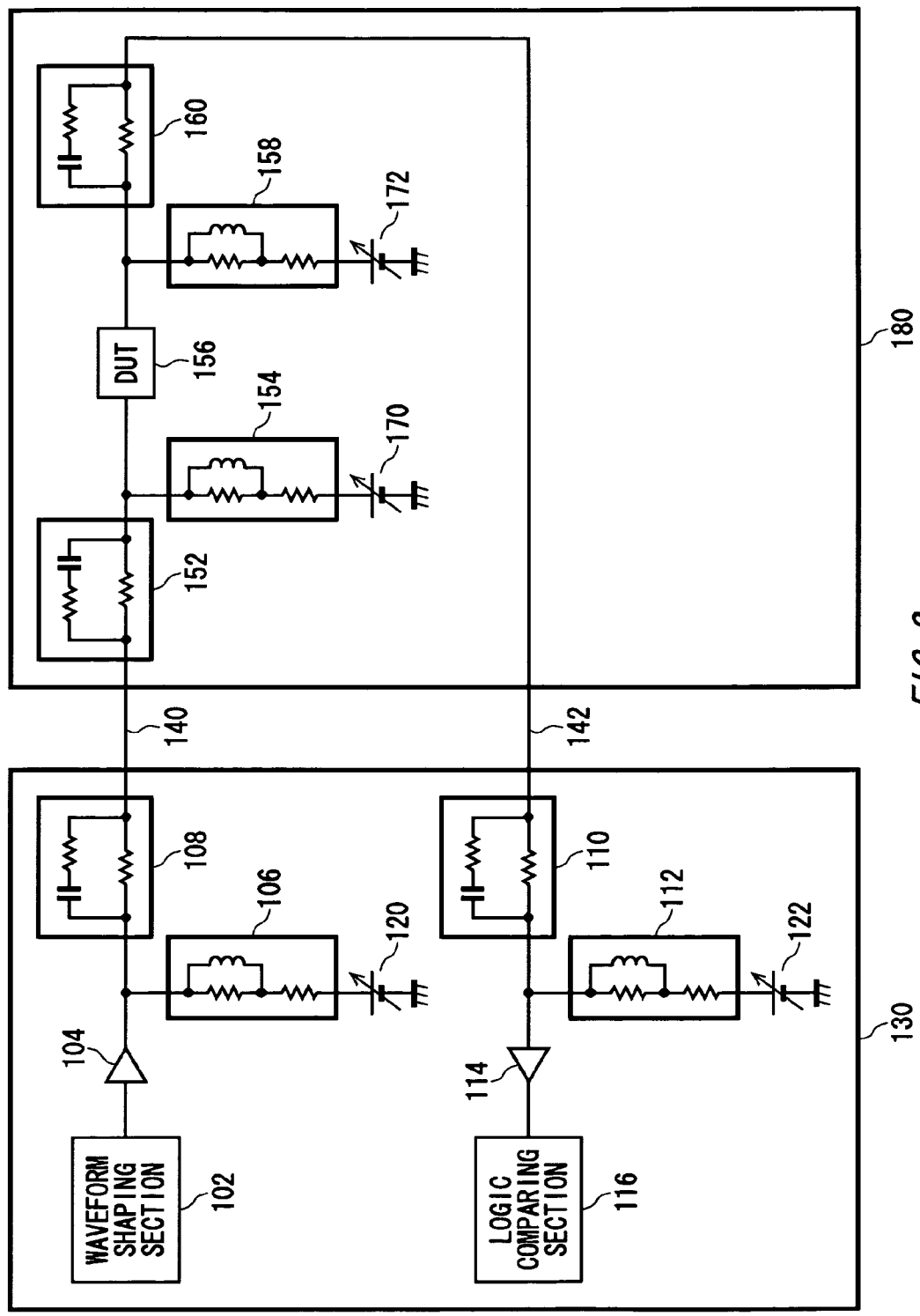
FIG. 2 is a block diagram showing one exemplary configuration of a signal transfer system according to a first modification in the first embodiment of the invention.

FIG. 2 is a block diagram showing one exemplary configuration of a signal transfer system 15 according to a first modification in the first embodiment of the invention. The signal transfer system 15 has a pin card 130 and a performance board 180 connected with the pin card 130 via transmission lines 140 and 142. It is noted that among the members shown in FIG. 2, those members denoted by the same reference numerals with those of the signal transfer system 10 shown in FIG. 1 have almost the same functions and configurations with the members of the signal transfer system 10 shown in FIG. 1, so that their explanation will be omitted here.

In addition to the members of the pin card 100 shown in FIG. 1, the pin card 130 has a reference potential supplying section 120 that is capable of arbitrarily varying the center level of the test signal as the reference potential to which the additional-type attenuator 106 is connected. The pin card 130 also has a reference potential supplying section 122 capable of arbitrarily varying terminal voltage of the comparator 114 as the reference potential to which the additional-type attenuator 112 is connected. It allows the DC level of the signal to be transmitted to be readily controlled even when the additional-type attenuator 106, the insertion-type attenuator 108, the insertion-type attenuator 110 and the additional-type attenuator 112 are used.

Meanwhile, in addition to the members of the performance board 150 shown in FIG. 1, the performance board 180 has a reference potential supplying section 170 that is capable of arbitrarily varying terminal voltage of the DUT 156 as the reference potential to which the additional-type attenuator 154 is connected. Still more, the performance board 180 has a reference potential supplying section 172 that is capable of arbitrary varying the center level of the output signal as the reference potential to which the additional-type attenuator 158 is connected. It allows the DC level of the signal to be transmitted to be readily controlled even when the insertion-type attenuator 152, the additional-type attenuator 154, the additional-type attenuator 158 and the insertion-type attenuator 160 are used.

Figure 3:
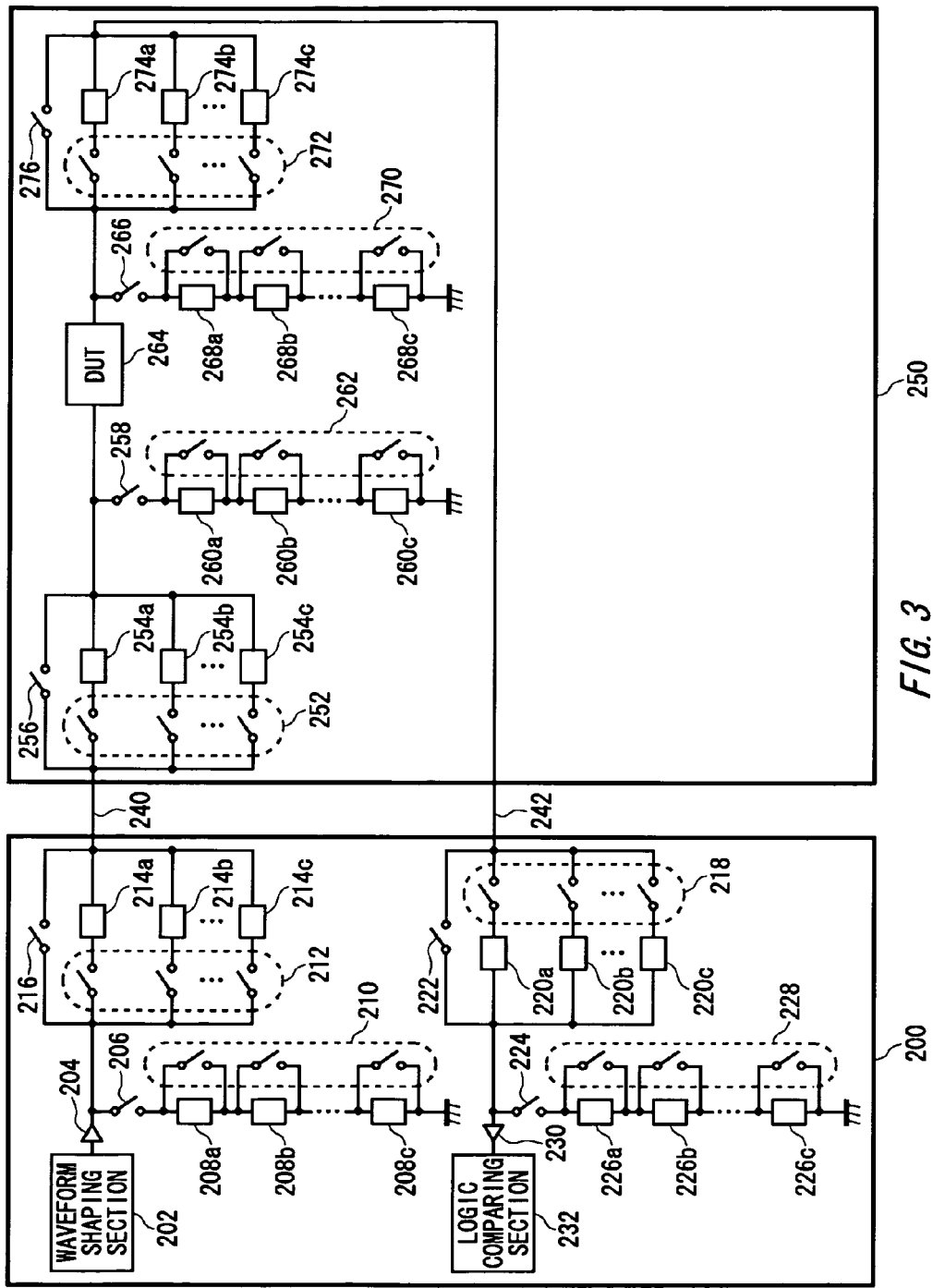
FIG. 3 is a block diagram showing one exemplary configuration of a signal transfer system according to a second modification in the first embodiment of the invention.

FIG. 3 is a block diagram showing one exemplary configuration of a signal transfer system 20 according to a second modification in the first embodiment of the invention. The signal transfer system 20 transmits a test signal to be fed to a DUT 264 in a test apparatus for testing semiconductor devices. The signal transfer system 20 has a pin card 200 provided for each of a plurality of terminals of the DUT 264 and a performance board 250 connected with the pin card 200 via transmission lines 240 and 242. Differing from the signal transfer system 10 shown in FIG. 1, the signal transfer system 20 has a plurality of insertion-type attenuators and a plurality of additional-type attenuators in each of the pin card 200 and the performance board 250 to correct a signal loss at high precision by using the arbitrary insertion-type attenuators and additional-type attenuators in combination in accordance to frequency and others of a signal to be transmitted. It is noted that the transmission lines 240 and 242 may be at least either one of a cable connecting the pin card 200 with the performance board 250 and a signal line on each board of the pin card 200 and the performance board 250.

The pin card 200 has a waveform shaping section 202, a driver 204, a disconnecting switch 206, a plurality of additional-type attenuators 208a, 208b and 208c (denoted as 208 hereinafter), an additional-type attenuator selecting switch 210, an insertion-type attenuator selecting switch 212, a plurality of insertion-type attenuators 214a, 214b and 214c (denoted as 214 hereinafter), a bypassing switch 216, an insertion-type attenuator selecting switch 218, a plurality of insertion-type attenuators 220a, 220b and 220c (denoted as 220 hereinafter), a bypassing switch 222, a disconnecting switch 224, a plurality of additional-type attenuators 226a, 226b and 226c (denoted as 226 hereinafter) an additional-type attenuator selecting switch 228, a comparator 230 and a logic comparing section 232. The waveform shaping section 202 shapes waveform of a test signal to be fed to the DUT 264 and outputs it to the driver 204. The driver 204 outputs the test signal received from the waveform shaping section 202 to the performance board 250 via the transmission line 240. The disconnecting switch 206 switches whether or not all of the additional-type attenuators 208 are to be disconnected from the transmission line 240. The plurality of additional-type attenuators 208 is provided between the transmission line 240 and the reference potential in series. It is noted that each of the additional-type attenuators 208 has almost the same configuration and function with those of the additional-type attenuator 106 shown in FIG. 1. However, the respective additional-type attenuators 208 attenuate the low-frequency signal differently. Here, the attenuation may mean an attenuation level or an attenuation band. That is, time constant of the attenuation may be different among the respective additional-type attenuators 208. The additional-type attenuator selecting switch 210 selects part of the additional-type attenuators 208 within the plurality of additional-type attenuators 208. Specifically, the additional-type attenuator selecting switch 210 controls so as to bypass the other additional-type attenuators 208 except of the part of the additional-type attenuators 208.

The insertion-type attenuator selecting switch 212 selects part of the insertion-type attenuators 214 within the plurality of insertion-type attenuators 214. Specifically, the insertion-type attenuator selecting switch 212 opens transmission paths to the other insertion-type attenuators 214 except of the part of the insertion-type attenuators 214. Each of the plurality of insertion-type attenuators 214 is provided in the transmission line 240 in parallel. It is noted that each of the insertion-type attenuators 214 has almost the same configuration and function with those of the insertion-type attenuators 108 shown in FIG. 1. However, the respective insertion-type attenuators 214 attenuate the low-frequency signal differently. The bypassing switch 216 switches whether or not to bypass all of the insertion-type attenuators 214 in the transmission line 240.

The performance board 250 has an insertion-type attenuator selecting switch 252, a plurality of insertion-type attenuators 254a, 254b and 254c (denoted as 254 hereinafter), a bypassing switch 256, a disconnecting switch 258, a plurality of additional-type attenuators 260a, 260b and 260c (denoted as 260 hereinafter), an additional-type attenuator selecting switch 262, a DUT 264, a disconnecting switch 266, a plurality of additional-type attenuators 268a, 268b and 268c (denoted as 268 hereinafter), an additional-type attenuator selecting switch 270, an insertion-type attenuator selecting switch 272, a plurality of insertion-type attenuators 274a, 274b and 274c (denoted as 274 hereinafter) and a bypassing switch 276. It is noted that the DUT 264 is one example of the receiving section of the invention. The insertion-type attenuator selecting switch 252 selects part of the insertion-type attenuators 254 within the plurality of insertion-type attenuators 254. Specifically, the insertion-type attenuator selecting switch 252 opens transmission paths to the other insertion-type attenuators 254 except of those of the part of the insertion-type attenuators 254. Each of the plurality of insertion-type attenuators 254 is provided within the transmission line 240 in parallel. It is noted that each of the insertion-type attenuators 254 has almost the same configuration and function with those of the insertion-type attenuator 152 shown in FIG. 1. However, the respective insertion-type attenuators 254 attenuate the low-frequency signal differently. The bypassing switch 256 switches whether or not to bypass all of the insertion-type attenuators 254 in the transmission line 240.

The disconnecting switch 258 switches whether or not to disconnect all of the additional-type attenuators 260 from the transmission line 240. The plurality of additional-type attenuators 260 is provided in series between the transmission line 240 and the reference potential. It is noted that each of the additional-type attenuators 260 has almost the same configuration and function with the additional-type attenuator 154 shown in FIG. 1. However, the respective additional-type attenuators 260 attenuate the low-frequency signal differently. The additional-type attenuator selecting switch 262 selects part of the additional-type attenuators 260 within the plurality of additional-type attenuators 260. Specifically, the additional-type attenuator selecting switch 262 controls so as to bypass the other additional-type attenuators 260 except of the part of the additional-type attenuators 260. The receiving section 264 receives the test signal outputted by the driver 204 and transmitted through the transmission line 240. Then, the receiving section 264 feeds the test signal to the DUT 264 via the contact terminal provided in the performance board 250.

In the signal transfer system 20 described above, each of the disconnecting switch 206, the additional-type attenuator selecting switch 210, the insertion-type attenuator selecting switch 212 and the bypassing switch 216 provided in the pin card 200 and each of the insertion-type attenuator selecting switch 252, the bypassing switch 256, the disconnecting switch 258 and the additional-type attenuator selecting switch 262 provided in the performance board 250 is provided so as to be controllable from the outside. Then, the signal transfer system 20 controls each of the switches described above so that composite impedance generated by the driver 204, the additional-type attenuator 208 selected by the additional-type attenuator selecting switch 210 within the plurality of additional-type attenuators 208 provided within the pin card 200 and the insertion-type attenuator 214 selected by the insertion-type attenuator selecting switch 212 within the plurality of insertion-type attenuators 214 provided within the pin card 200 is substantially equalized with impedance of the transmission line 240. Still more, the signal transfer system 20 controls each of the switches described above so that composite impedance generated by the insertion-type attenuator 254 selected by the insertion-type attenuator selecting switch 252 within the plurality of insertion-type attenuators 254 provided within the performance board 250, the additional-type attenuator 260 selected by the additional-type attenuator selecting switch 262 within the plurality of additional-type attenuators 260 provided within the performance board 250 and the DUT 264 is substantially equalized with the impedance of the transmission line 240. Here, the test apparatus or its user may control each of the switches described above based on measuring results of frequency characteristics such as attenuation level and impedance of the transmission line 240 and on frequency characteristics already found in the pin card 200, the performance board 250 and others.

While the case of transmitting the test signal to be fed to the DUT 264 has been explained above, a case of transmitting an output signal of the DUT 264 will be explained next. The DUT 264 outputs the output signal generated in correspondence to the test signal to the comparator 230 via the transmission line 242. The disconnecting switch 266 switches whether or not all of the additional-type attenuators 268 are to be disconnected from the transmission line 242. The plurality of additional-type attenuators 268 is provided in series between the transmission line 242 and the reference potential. It is noted that each of the additional-type attenuators 268 has almost the same configuration and function with those of the additional-type attenuator 158 shown in FIG. 1. However, the respective additional-type attenuators 268 attenuate the low-frequency signal differently. The additional-type attenuator selecting switch 270 selects part of the additional-type attenuators 268 within the plurality of additional-type attenuators 268. Specifically, the additional-type attenuator selecting switch 270 controls so as to bypass the other additional-type attenuators 268 except of the part of the additional-type attenuators 268.

The insertion-type attenuator selecting switch 272 selects part of the insertion-type attenuators 274 within the plurality of insertion-type attenuators 274. Specifically, the insertion-type attenuator selecting switch 272 opens transmission paths to the other insertion-type attenuators 274 except of those of the part of the insertion-type attenuators 274. Each of the plurality of insertion-type attenuators 274 is provided in the transmission line 242 in parallel. It is noted that each of the insertion-type attenuators 274 has almost the same configuration and function with those of the insertion-type attenuator 160 shown in FIG. 1. However, the respective insertion-type attenuators 274 attenuate the low-frequency signal differently. The bypassing switch 276 switches whether or not to bypass all of the insertion-type attenuators 274 in the transmission line 242.

The insertion-type attenuator selecting switch 218 selects part of the insertion-type attenuators 220 within the plurality of insertion-type attenuators 220. Specifically, the insertion-type attenuator selecting switch 218 opens transmission paths to the other insertion-type attenuators 220 except of those of the part of the insertion-type attenuators 220. Each of the plurality of insertion-type attenuators 220 is provided in the transmission line 242 in parallel. It is noted that each of the insertion-type attenuators 220 has almost the same configuration and function with those of the insertion-type attenuator 110 shown in FIG. 1. However, the respective insertion-type attenuators 220 attenuate the low-frequency signal differently. The bypassing switch 222 switches whether or not to bypass all of the insertion-type attenuators 220 in the transmission line 242.

The disconnecting switch 224 switches whether or not all of the additional-type attenuators 226 are to be disconnected from the transmission line 242. The plurality of additional-type attenuators 226 is provided in series between the transmission line 242 and the reference potential. It is noted that each of the additional-type attenuators 226 has almost the same configuration and function with those of the additional-type attenuator 112 shown in FIG. 1. However, the respective additional-type attenuators 226 attenuate the low-frequency signal differently. The additional-type attenuator selecting switch 228 selects part of the additional-type attenuators 226 within the plurality of additional-type attenuators 226. Specifically, the additional-type attenuator selecting switch 228 controls so as to bypass the other additional-type attenuators 226 except of the part of the additional-type attenuator 226. The comparator 230 receives the output signal outputted out of the DUT 264 and transmitted through the transmission line 242. Then, the comparator 230 compares the received output signal with the reference voltage and outputs the comparison result to the logic comparing section 232. When the comparison result of the output signal with the reference voltage received from the comparator 230 coincides with a reference value set in advance, the logic comparing section 232 judges that the DUT 264 is defect-free.

In the signal transfer system 20 described above, each of the disconnecting switch 266, the additional-type attenuator selecting switch 270, the insertion-type attenuator selecting switch 272 and the bypassing switch 276 provided in the performance board 250 as well as each of the insertion-type attenuator selecting switch 218, the bypassing switch 222, the disconnecting switch 224 and the additional-type attenuator selecting switch 228 provided in the pin card 200 is provided so as to be controllable from the outside. Then, in the signal transfer system 20, each of the switches described above is controlled so that composite impedance generated by the insertion-type attenuator 220 selected by the insertion-type attenuator selecting switch 218 within the plurality of insertion-type attenuators 220 provided within the pin card 200, the additional-type attenuator 226 selected by the additional-type attenuator selecting switch 228 within the plurality of additional-type attenuators 226 provided within the pin card 200 and the comparator 230 is substantially equalized with impedance of the transmission line 242. Still more, in the signal transfer system 20, each of the switches described above is controlled so that composite impedance generated by the insertion-type attenuator 220 selected by the insertion-type attenuator selecting switch 218 within the plurality of insertion-type attenuators 220 provided within the pin card 200, the additional-type attenuator 226 selected by the additional-type attenuator selecting switch 228 within the plurality of additional-type attenuators 226 provided within the pin card 200 and the comparator 230 is substantially equalized with the impedance of the transmission line 242. Here, the test apparatus or its user may control each of the switches described above based on measuring results of frequency characteristics such as the attenuation level and impedance of the transmission line 242 and on frequency characteristics already found in the pin card 200, the performance board 250 and others.

The signal may be controlled so as to bypass all of the insertion-type attenuators 214 by turning on the bypassing switch 216 provided within the pin card 200 in the signal transfer system 20 of the second modification of the first embodiment of the invention. Therefore, it becomes possible to transmit the signal without lowering its signal level by turning on the bypassing switch 216 so that the signal bypasses all of the insertion-type attenuators 214 when the signal attenuation level and impedance of the transmission line 240 are low. It becomes also possible to transmit the signal without lowering the signal level by opening the disconnecting switch 206 provided within the pin card 200 so that all of the additional-type attenuators 208 are disconnected from the transmission line 240 when the signal attenuation level and impedance of the transmission line 240 are low. It is noted that the same effect with that described above may be obtained by turning on the bypassing switch 222, the bypassing switch 256 or the bypassing switch 276 or by opening the disconnecting switch 224, the disconnecting switch 258 or the disconnecting switch 266.

Lately, an open architecture in which interfaces of units such as a pin card and a performance board are standardized is desired for the test apparatus for testing semiconductor devices so that various makers can manufacture such units. However, it is necessary to transmit a very quick and accurate signal whose delay time is controlled in the order of 10 picoseconds and the like in the test apparatus. Therefore, it is very difficult to fully match impedances among such units based on the open architecture when the respective units are manufactured by makers different from each other. Still more, although the attenuation level in each of the high and low frequency signals must coincide at enough precision in transmitting a signal such as the test signal, it is difficult to coincide the attenuation level at the enough precision when the units manufactured by the various makers are used in combination. Such problems grow as bigger problems as the frequency of the signal to be transmitted increases.

However, according to the signal transfer system 20 of the second modification of the first embodiment of the invention, it becomes possible to reduce the difference of the attenuation level of the high and low frequency signals and to match the impedances in the transmission line 240 by controlling the insertion-type attenuator selecting switches and additional-type attenuator selecting switches provided respectively in the pin card 200 and the performance board 250 based on the frequency of the signal to be transmitted and the frequency characteristics of the transmission lines even when the pin card 200 and the performance board 250 are manufactured by makers different from each other.

It is noted that the configuration of the signal transfer system 20 is not limited to that shown in the figure and various modifications may be added to the configuration shown in the figure. For example, the signal transfer system 20 may lack at least a part of sets among the sets of the plurality of additional-type attenuators 208 and the plurality of insertion-type attenuators 214, of the plurality of insertion-type attenuators 254 and the plurality of additional-type attenuators 260, of the plurality of additional-type attenuators 68 and the plurality of additional-type attenuators 276 and of the plurality of insertion-type attenuators 220 and the plurality of additional-type attenuators 226. That is, it is not necessary for the signal transfer system 20 to have the set of the insertion-type attenuators and additional-type attenuators at least on one side of the 00 and the performance board 250 in each of the transmission line 240 for transmitting the test signal and the transmission line 242 for transmitting the output signal.

Still more, the disposition of the plurality of insertion-type attenuators and the plurality of additional-type attenuators in each of the sets of the plurality of insertion-type attenuators and the plurality of additional-type attenuators may be reversed from the disposition shown in the figure. Specifically, the plurality of insertion-type attenuators 214 may be provided between the insertion-type attenuator 214 and the plurality of additional-type attenuators 208. However, it is preferable to provide each of the driver 204, the plurality of additional-type attenuators 208 and the plurality of insertion-type attenuators 214 closely from each other in this case also. Similarly to that, the plurality of insertion-type attenuators and additional-type attenuators may be provided in the pin card 200 or the performance board 250 by reversing their disposition from that shown in the figure also in the respective sets of the plurality of insertion-type attenuators 254 and the plurality of additional-type attenuators 260, of the plurality of additional-type attenuators 268 and the plurality of insertion-type attenuators 274 and of the insertion-type attenuators 220 and the plurality of additional-type attenuators 226.

Figure 4:
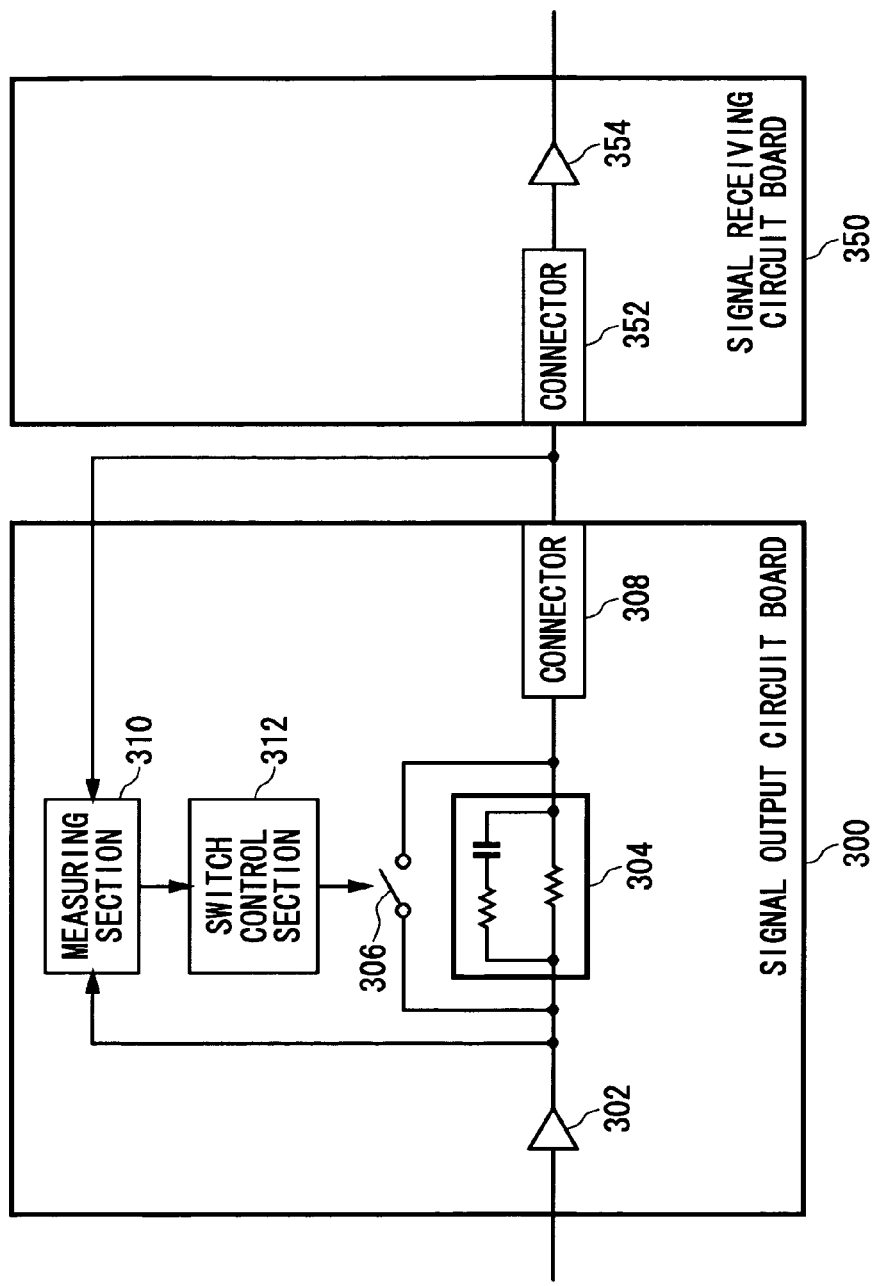
FIG. 4 is a block diagram showing one exemplary configuration of a signal transfer system according to a modification of a second embodiment of the invention.

FIG. 4 is a block diagram showing one exemplary configuration of a signal transfer system 30 according to a modification of a second embodiment of the invention. The signal transfer system 30 has a signal outputting circuit board 300 for outputting a signal to the outside and a signal receiving circuit board 350, connected with the signal outputting circuit board 300 by means of a cable or the like, for receiving a signal from the outside and transmits the signal from the signal outputting circuit board 300 to the signal receiving circuit board 350. Here, length of a transmission line from the signal outputting circuit board 300 to the signal receiving circuit board 350 changes and thereby an attenuation level of the signal in the transmission line also changes depending on a slot into which each of the signal outputting circuit board 300 and the signal receiving circuit board 350 is inserted among a plurality of slots of the signal transfer system 30.

An object of the signal transfer system 30 of the second embodiment of the invention is to transmit a high-quality signal whose difference of attenuation level of high and low frequency signals is always fully small even when factors that affect the attenuation level of the high-frequency signal such as the length of the transmission line for transmitting the signal vary.

The signal outputting circuit board 300 has a driver 302, an insertion-type attenuator 304, a bypassing switch 306, a connector 308, a measuring section 310 and a switch control section 312. The driver 302 receives a signal to be transmitted from a signal generating source or the like and outputs it. The insertion-type attenuator 304 is inserted between the driver 302 and the connector 308 in series and largely attenuates the low-frequency signal more than the high-frequency signal. Here, the high and low frequency signals may be high and low frequency components of the signal. The bypassing switch 306 switches whether or not to bypass the insertion-type attenuator 304. The connector 308 sends out the signal outputted out of the driver 302 to the outside of the signal outputting circuit board 300, i.e., to the signal receiving circuit board 350 in this example.

The measuring section 310 measures the attenuation level of the high and low frequency signals in the transmission path from the driver 302 to the signal receiving circuit board 350 when the signal receiving circuit board 350 that receives the signal outputted out of the driver 302 is connected with the signal outputting circuit board 300 via the connector 308. For example, the measuring section 310 may measure the attenuation level of the high and low frequency signals in the transmission path by measuring the level of the signal in the vicinity of an output terminal of the driver 302 and in the vicinity of the signal receiving circuit board 350 in the transmission path from the driver 302 to the signal receiving circuit board 350. Still more, the measuring section 310 may measure the attenuation level of the high and low frequency signals in the transmission path by measuring level of the signal inputted to the driver 302, level of the signal within the signal receiving circuit board 350 or level of the signal outputted out of the signal receiving circuit board 350 after being received by the signal receiving circuit board 350. It is noted that the measurement of the attenuation level performed by the measuring section 310 may be carried out in a step before transmitting the signal in the signal transfer system 30 and the measuring section 310 may be disconnected from the transmission path from the driver 302 to the signal receiving circuit board 350 during when the signal is normally transmitted.

The switch control section 312 controls ON/OFF states of the bypassing switch 306 based on the measured result of the attenuation level of the high and low-frequency signals in the transmission path from the driver 302 to the signal receiving circuit board 350 obtained by the measuring section 310. Specifically, the switch control section 312 turns on the bypassing switch 306 when the attenuation level measured by the measuring section 310 is smaller than a reference value set in advance. Here, the reference value set in advance may be a maximum value of the attenuation level of the high and low-frequency signals when the difference of the high and low-frequency signals is judged to be fully small when the signal receiving circuit board 350 receives the signal and may be set by the user of the signal transfer system 30 in advance.

The signal receiving circuit board 350 has a connector 352 and a receiver 354. The connector 352 receives the signal to be received from the outside of the signal receiving circuit board 350, i.e., the signal outputting circuit board 300 in this example, and outputs it to the receiver 354. The receiver 354 receives the signal outputted out of the signal outputting circuit board 300 via the connector 352.

The signal transfer system 30 of the second embodiment of the invention controls whether or not to bypass the insertion-type attenuator 304 based on the measured result of the attenuation level of the high and low-frequency signals measured by the measuring section 310. Then, when the attenuation level is significant, the signal transfer system 30 corrects the difference of the attenuation level of the high and low-frequency signals by using the insertion-type attenuator 304. When the attenuation level is minor on the other hand, the signal transfer system 30 can transmit the signal without lowering the signal level by transmitting the signal without passing through the insertion-type attenuator 304. Thereby, the signal transfer system 30 can always transmit the high-quality signal whose difference of attenuation level of the high and low-frequency signals is fully small even when the factors that affect the attenuation level of the high-frequency signal such as the length of the signal transmission path vary depending on environments and other where the signal outputting circuit board 300 and the signal receiving circuit board 350 are installed.

It is noted that the configuration of the signal transfer system 30 is not limited to that shown in the figure and various modifications may be added to the configuration shown in the figure. For example, the measuring section 310 may be provided on the outside of the signal outputting circuit board 300. It is apparently possible to control the bypassing switch 306 based on the measured result of the measuring section 310 also in this case similarly to the case explained above. Still more, the insertion-type attenuator 304, the bypassing switch 306, the measuring section 310 and the switch control section 312 may be provided in the signal receiving circuit board 350, instead of the signal outputting circuit board 300. In this case, the insertion-type attenuator 304 and the bypassing switch 306 may be provided between the connector 352 and the receiver 354. Then, in the signal receiving circuit board 350, it is controlled whether or not to bypass the insertion-type attenuator 304 based on the measured result of the attenuation level of the high and low-frequency signals in the transmission path from the signal outputting circuit board 300 to the receiver 354 measured by the measuring section 310.

Figure 5:
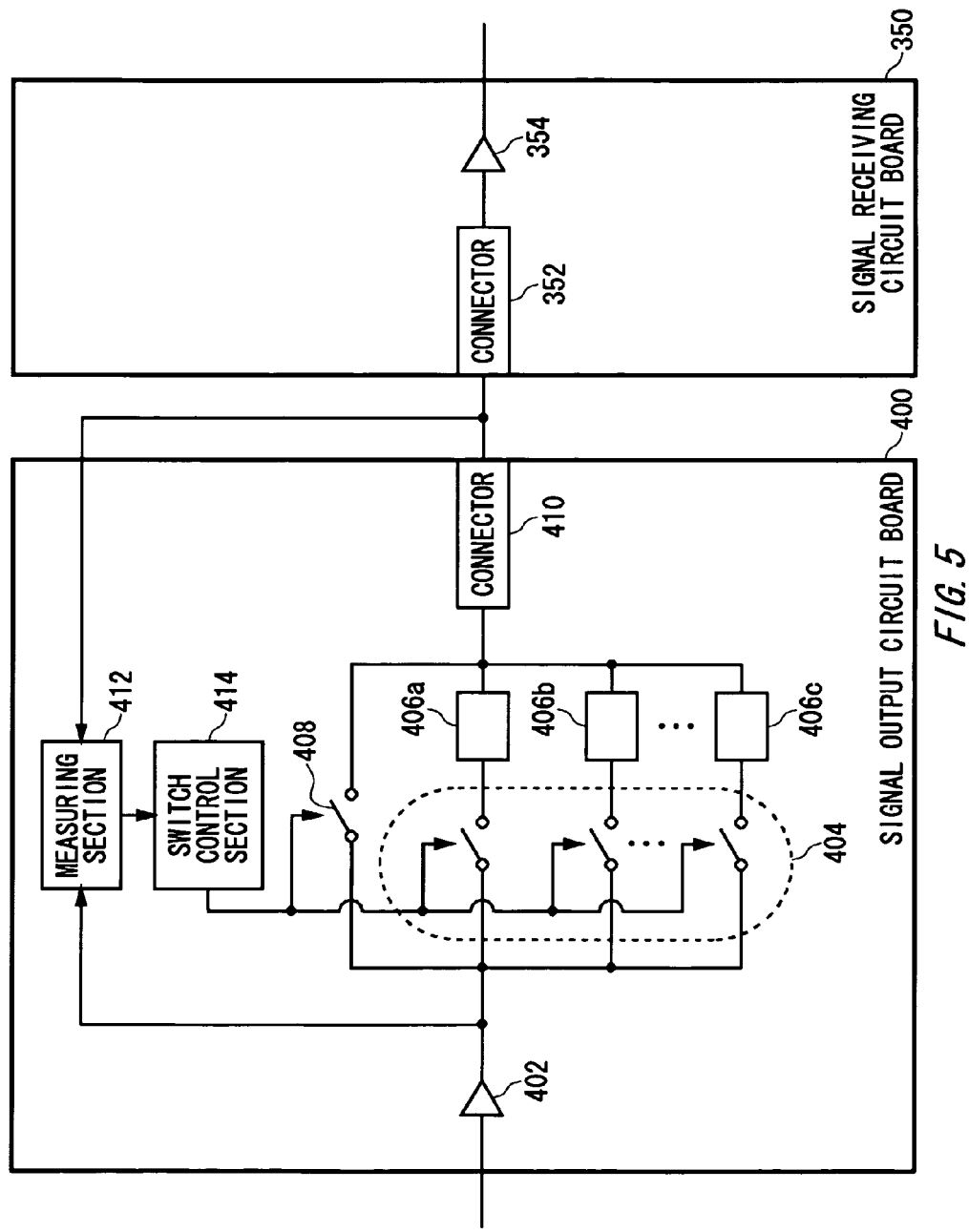
FIG. 5 is a block diagram showing one exemplary configuration of a signal transfer system according to a modification of the second embodiment of the invention.

FIG. 5 is a block diagram showing one exemplary configuration of a signal transfer system 40 according to a modification of the second embodiment of the invention. The signal transfer system 40 has a signal outputting circuit board 400 for outputting a signal to the outside and a signal receiving circuit board 350, connected with the signal outputting circuit board 400 via a cable and the like, for receiving a signal from the outside and transmits the signal from the signal outputting circuit board 400 to the signal receiving circuit board 350. Differing from the signal transfer system 30 shown in FIG. 4, the signal transfer system 40 has a plurality of insertion-type attenuators in the signal outputting circuit board 400 and reduces the difference of the attenuation level of the high and low-frequency signals by using the arbitrary insertion-type attenuators in combination corresponding to frequency and the like of the signal to be transmitted. It is noted that because the signal receiving circuit board 350 shown in this figure has almost the same configuration and function with the signal receiving circuit board 350 shown in FIG. 4, its explanation will be omitted here, except of their differences.

The signal outputting circuit board 400 has a driver 402, an insertion-type attenuator selecting switch 404, a plurality of insertion-type attenuator selecting switches 406a, 406b and 406c (denoted as 406 hereinafter), a connector 410, a measuring section 412 and a switch control section 414. The driver 402 receives the signal to be transmitted from the signal source or the like and outputs it. The insertion-type attenuator selecting switch 404 selects part of the insertion-type attenuators 406 within the plurality of insertion-type attenuators 406. Specifically, the insertion-type attenuator selecting switch 404 opens transmission paths to the other insertion-type attenuators 406 except of those of the part of the insertion-type attenuators 406. Each of the plurality of insertion-type attenuators 406 is provided between the driver 402 and the connector 410 in parallel. It is noted that each of the insertion-type attenuators 406 has almost the same configuration and function with those of the insertion-type attenuator 304 shown in FIG. 4. However, the respective insertion-type attenuators 406 attenuate the low-frequency signal differently. Here, the attenuation may mean an attenuation level or an attenuation band. That is, an attenuation time constant may differ in each of the insertion-type attenuators 406. The bypassing switch 408 switches whether or not to bypass all of the insertion-type attenuators 406. The connector 410 sends out the signal outputted out of the driver 402 to the outside of the signal outputting circuit board 400, i.e., to the signal receiving circuit board 350 in this example.

The measuring section 412 measures the attenuation level of the high-frequency signal in the transmission path from the driver 402 to the signal receiving circuit board 350 when the signal receiving circuit board 350 that receives the signal outputted out of the driver 402 is connected with the signal outputting circuit board 400 via the connector 410. For example, the measuring section 412 may measure the attenuation level of the high-frequency signal in the transmission path by measuring the signal level in the vicinity of an output terminal of the driver 402 and that in the vicinity of the signal receiving circuit board 350 in the transmission path from the driver 402 to the signal receiving circuit board 350. It is noted that the measurement of the attenuation level by the measuring section 412 may be carried out in a step before transmitting the signal in the signal transfer system 40 and the measuring section 412 may be disconnected from the transmission path from the driver 402 to the signal receiving circuit board 350 during when the signal is normally transmitted.

The switch control section 414 controls the ON/OFF states of the bypassing switch 408 and the insertion-type attenuator selecting switch 404 based on the measured result of the attenuation level of the high-frequency signal in the transmission path from the driver 402 to the signal receiving circuit board 350 measured by the measuring section 412. Specifically, the switch control section 414 turns on the bypassing switch 408 when the attenuation level measured by the measuring section 412 is smaller than a reference value set in advance. Further, the switch control section 414 causes the insertion-type attenuator selecting switch 404 to select a part of the insertion-type attenuators 406 within the plurality of insertion-type attenuators 406 based on the attenuation level measured by the measuring section 412. Here, the switch control section 414 causes the insertion-type attenuator selecting switch 404 to select the insertion-type attenuators 406 in such a combination by which the difference of the attenuation level in the low and high frequency signals becomes fully small when the signal attenuation level caused by the transmission lines including the signal lines in the signal outputting circuit board 400 and the signal receiving circuit board 350 and the cables connecting the signal outputting circuit board 400 with the signal receiving circuit board 350 and the signal attenuation level caused by the selected insertion-type attenuators 406 are totaled.

Thus, the signal transfer system 40 of the modification of the second embodiment of the invention allows the process of attenuating the low-frequency signal by a desired level to be carried out at high precision by selecting the part of the insertion-type attenuators 406 within the plurality of insertion-type attenuators 406 in which the attenuation level of low-frequency signal is different to attenuate the signal to be outputted. Accordingly, the signal transfer system 40 can always transmit the high-quality signal in which the difference of attenuation level of the high and low-frequency signals is fully small even when the factors that affect the attenuation level of the high-frequency signal such as length of the signal transmission path vary depending on environments and others in which the signal outputting circuit board 400 and the signal receiving circuit board 350 are installed.

It is noted that the configuration of the signal transfer system 40 is not limited to that shown in the figure and various modifications may be added to the configuration shown in the figure. For example, the measuring section 412 may be provided on the outside of the signal outputting circuit board 400. It is apparently possible to control the bypassing switch 408 and the insertion-type attenuator selecting switch 404 based on the measured result of the measuring section 412 also in this case in the same manner as described above. Still more, the insertion-type attenuator selecting switch 404, the plurality of insertion-type attenuators 406, the bypassing switch 408, the measuring section 412 and the switch control section 414 may be provided in the signal receiving circuit board 350, instead of the signal outputting circuit board 400. In this case, the insertion-type attenuator selecting switch 404, the plurality of insertion-type attenuators 406 and the bypassing switch 408 may be provided between the connector 352 and the receiver 354. Then, the bypassing switch 408 and the insertion-type attenuator selecting switch 404 are controlled in the signal receiving circuit board 350 based on the measured result of the attenuation level of the high and low-frequency signals in the transmission path from the signal outputting circuit board 400 to the receiver 354 measured by the measuring section 412.

Figure 6:
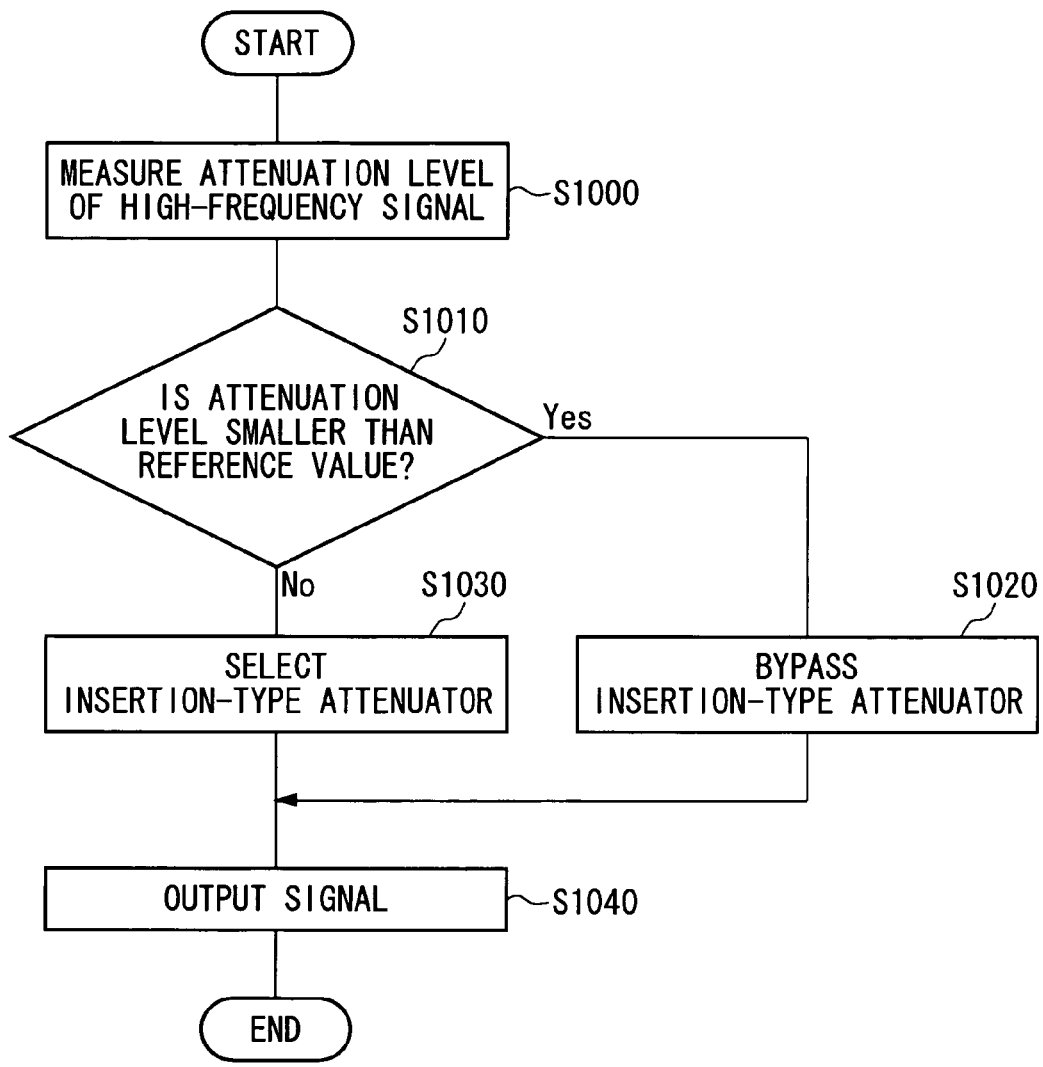
FIG. 6 is a flowchart showing one exemplary flow of processes in the signal transfer system according to the modification of the second embodiment of the invention.

FIG. 6 is a flowchart showing one exemplary flow of processes in the signal transfer system 40 according to the modification of the second embodiment of the invention. At first, the measuring section 412 measures the attenuation level of the high-frequency signal in the transmission path from the driver 402 to the signal receiving circuit board 350 in Step S1000. Next, the switch control section 414 judges whether or not the attenuation level measured by the measuring section 412 is smaller than the reference value set in advance in Step S1010. When the measured attenuation level is judged to be smaller than the reference value set in advance, i.e., Yes in Step S1010, the switch control section 414 turns on the bypassing switch 408 so as to bypass all of the insertion-type attenuators 406 in Step S1020. When the measured attenuation level is judged to be not smaller than the reference value set in advance, i.e., No in Step S1010, the switch control section 414 causes the insertion-type attenuator selecting switch 404 to select the part of the insertion-type attenuators 406 within the plurality of insertion-type attenuators 406 to turn on the transmission paths to the selected insertion-type attenuators 406 in Step S1030. Then, the driver 402 outputs the signal to the signal receiving circuit board 350 via the connector 410 in Step S1040.

Figure 7:
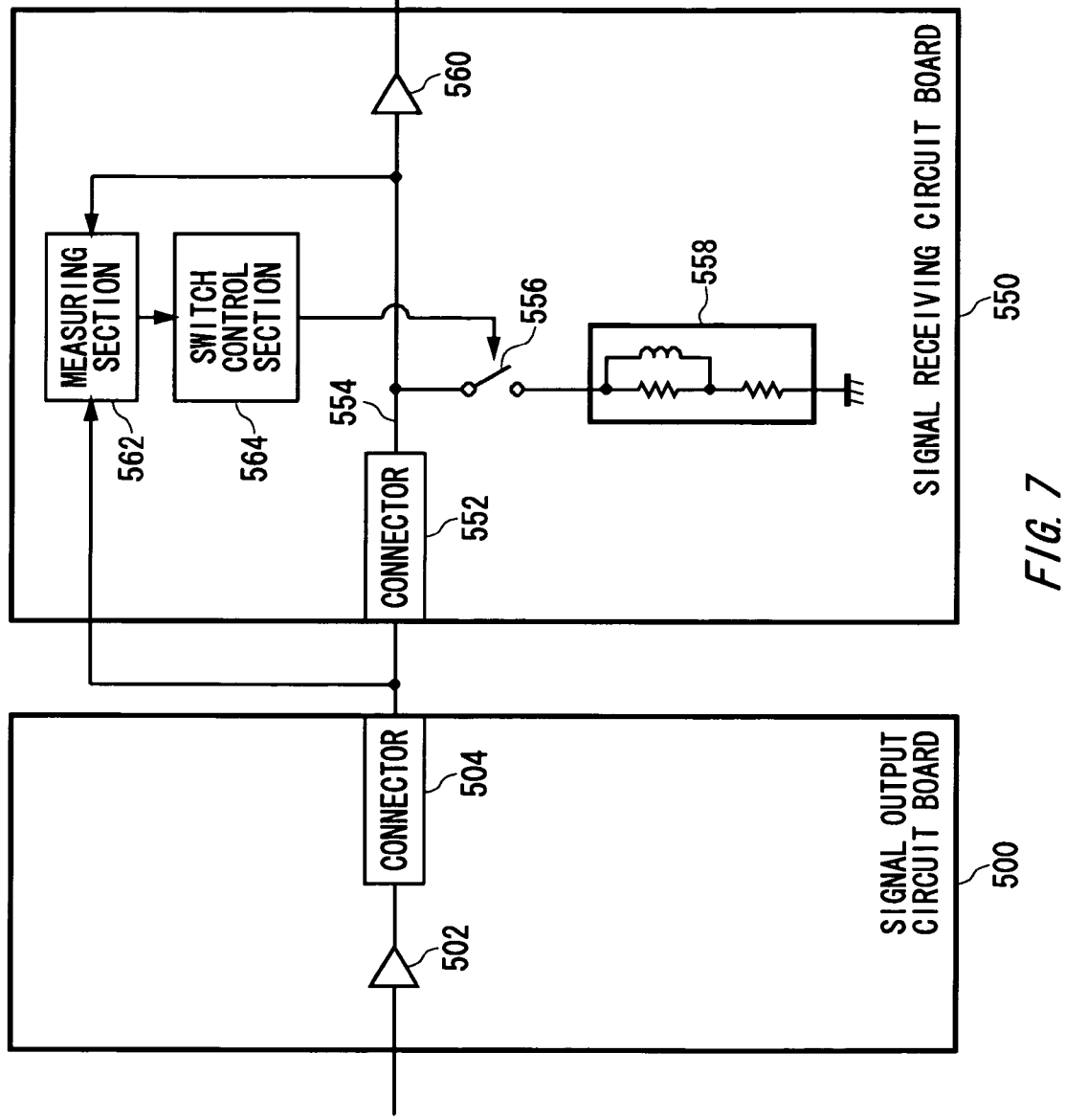
FIG. 7 is a block diagram showing one exemplary configuration of a signal transfer system according to a third embodiment of the invention.

FIG. 7 is a block diagram showing one exemplary configuration of a signal transfer system 50 according to a third embodiment of the invention. The signal transfer system 50 has a signal outputting circuit board 500 for outputting a signal to the outside and a signal receiving circuit board 550, connected with the signal outputting circuit board 500 by means of a cable or the like, for receiving a signal from the outside and transmits the signal from the signal outputting circuit board 500 to the signal receiving circuit board 550. Here, length of the signal transmission line from the signal outputting circuit board 500 to the signal receiving circuit board 550 changes and thereby an attenuation level of the signal in the transmission line varies depending on a slot into which each of the signal outputting circuit board 500 and the signal receiving circuit board 550 is inserted among a plurality of slots of the signal transfer system 50.

An object of the signal transfer system 50 of the second embodiment of the invention is to transmit a high-quality signal whose difference of attenuation level of high and low frequency signals is always fully small even when a factor that affects the attenuation level of the high-frequency signal such as the length of the transmission line for transmitting the signal varies.

The signal outputting circuit board 500 has a driver 502 and a connector 504. The driver 502 receives a signal to be transmitted from a signal source or the like and outputs it to the connector 504. The connector 504 sends out the signal outputted out of the driver 502 to the outside of the signal outputting circuit board 500, i.e., to the signal receiving circuit board 550 in this example.

The signal receiving circuit board 550 has a connector 552, a signal line 554, a disconnecting switch 556, an additional-type attenuator 558, a receiver 560, a measuring section 562 and a switch control section 564. The connector 552 receives the signal from the outside of the signal receiving circuit board 550, i.e., from the signal outputting circuit board 500 in this example. The signal line 554 transmits the signal from the connector 552 to the receiver 560. Here, the signal line 554 is a part of the transmission line of the signal from the signal outputting circuit board 500 to the signal receiving circuit board 550. The disconnecting switch 556 switches whether or not to disconnect the additional-type attenuator 558 from the signal line 554. The additional-type attenuator 558 connects the signal line 554 from the connector 552 to the receiver 560 with the reference potential and largely attenuates the low-frequency signal more than the high-frequency signal. Here, the high and low-frequency signals may be high and low frequency components of the signal. The receiver 560 receives the signal outputted out of the signal outputting circuit board 500 via the connector 552.

The measuring section 562 measures an attenuation level of the high-frequency signal in the transmission path from the signal outputting circuit board 500 to the receiver 560 when the signal outputting circuit board 500 for sending out the signal to be transmitted is connected with the signal receiving circuit board 550 via the connector 552. For example, the measuring section 562 may measure the attenuation level of the high-frequency signal in the transmission path by measuring the level of the signal in the vicinity of the signal outputting circuit board 500 and in the vicinity of an input terminal of the receiver 560 in the transmission path from the signal outputting circuit board 500 to the receiver 560. Still more, the measuring section 562 may measure the attenuation level of the high-frequency signal in the transmission path by measuring the level of the signal inputted to the signal outputting circuit board 500, the level of the signal within the signal outputting circuit board 500 or the level of the signal outputted out of the receiver 560 after being received by the receiver 560. It is noted that the measurement of the attenuation level by the measuring section 562 may be carried out in a step before transmitting the signal in the signal transfer system 50 and the measuring section 562 may be disconnected from the transmission path from the signal outputting circuit board 500 to the receiver 560 during when the signal is normally transmitted.

The switch control section 564 controls the ON/OFF states of the disconnecting switch 556 based on the measured result of the attenuation level of the high-frequency signal in the transmission path from the signal outputting circuit board 500 to the receiver 560 measured by the measuring section 562. Specifically, the switch control section 564 disconnects the additional-type attenuator 558 from the signal line 554 by the disconnecting switch 556 when the attenuation level measured by the measuring section 562 is smaller than a reference value set in advance. Here, the reference value set in advance may be a maximum value of the attenuation level of the high-frequency signal when the difference of the attenuation level of the high and low-frequency signals is judged to be fully small when the receiver 560 receives the signal and may be set in advance by the user of the signal transfer system 50.

The signal transfer system 50 of the third embodiment of the invention controls whether or not to disconnect the additional-type attenuator 558 based on the measured result of the attenuation level of the high-frequency signal measured by the measuring section 562. Then, when the attenuation level is large, the signal transfer system 50 corrects the difference of the attenuation level of the high and low-frequency signals by using the additional-type attenuator 558. When the attenuation level is small on the other hand, the signal transfer system 50 can transmit the signal without lowering the signal level by not using the additional-type attenuator 558. Thereby, the signal transfer system 50 can always transmit the high-quality signal in which the difference of attenuation level of the high and low-frequency signals is fully small even when the factors that affect the attenuation level of the high-frequency signal such as the length of the signal transmission path vary depending on environments and others in which the signal outputting circuit board 500 and the signal receiving circuit board 550 are installed.

It is noted that the configuration of the signal transfer system 50 is not limited to that shown in the figure and various modifications may be added to the configuration shown in the figure. For example, the measuring section 562 may be provided on the outside of the signal receiving circuit board 550. It is apparently possible to control the disconnecting switch 556 based on the measured result of the measuring section 562 also in this case in the same manner as described above. Still more, the disconnecting switch 556, the additional-type attenuator 558, the measuring section 562, and the switch control section 564 may be provided in the signal outputting circuit board 500, instead of the signal receiving circuit board 550. In this case, the disconnecting switch 556 and the additional-type attenuator 558 may be provided between the driver 502 and the connector 504. Then, the signal transfer system 50 controls whether or not to disconnect the additional-type attenuator 558 based on the measured result of the attenuation level of the high and low-frequency signals in the transmission path from the driver 502 to the signal receiving circuit board 350 measured by the measuring section 562.

Figure 8:
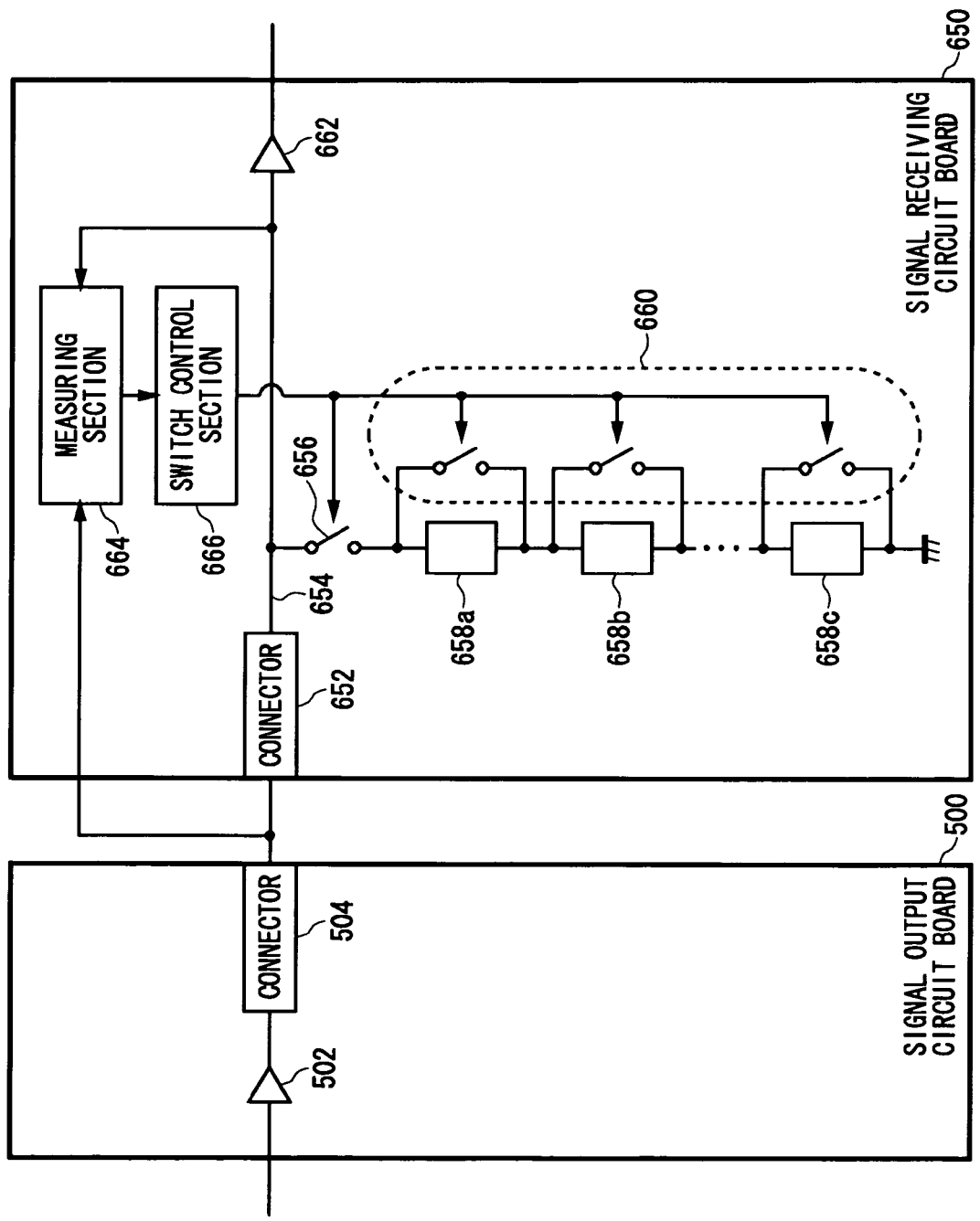
FIG. 8 is a block diagram showing one exemplary configuration of a signal transfer system according to a modification of the third embodiment of the invention.

FIG. 8 is a block diagram showing one exemplary configuration of a signal transfer system 60 according to a modification of the third embodiment of the invention. The signal transfer system 60 has a signal outputting circuit board 500 for outputting a signal to the outside and a signal receiving circuit board 650, connected with the signal outputting circuit board 500 by means of a cable or the like, for receiving a signal from the outside and transmits the signal from the signal outputting circuit board 500 to the signal receiving circuit board 650. Differing from the signal transfer system 50 shown in FIG. 7, the signal transfer system 60 has a plurality of additional-type attenuators in the signal receiving circuit board 650 and reduces the difference of attenuation level of the high and low-frequency signals by using the arbitrary additional-type attenuators in combination corresponding to frequency and others of the signal to be transmitted. It is noted that because the signal outputting circuit board 500 shown in the figure has almost the same configuration and function with the signal outputting circuit board 500 shown in FIG. 7, its explanation will be omitted here except of their differences.

The signal receiving circuit board 650 has a disconnecting switch 656, a plurality of additional-type attenuators 658a, 658b and 658c (denoted as 658 hereinafter), an additional-type attenuator selecting switch 660, a receiver 662, a measuring section 664 and a switch control section 666. The connector 652 receives the signal from the outside of the signal receiving circuit board 650, i.e., from the signal outputting circuit board 500 in this example. The signal line 654 transmits the signal from the connector 652 to the receiver 662. Here, the signal line 654 is a part of the transmission line of the signal from the signal outputting circuit board 500 to the signal receiving circuit board 650. The disconnecting switch 656 switches whether or not to disconnect all of the additional-type attenuators 658 from the signal line 654. Each of the plurality of additional-type attenuators 658 is connected in series between the connector 652 and the receiver 662. It is noted that each of the additional-type attenuators 658 has almost the same configuration and function with those of the additional-type attenuator 558 shown in FIG. 7. However, the respective additional-type attenuators 658 attenuate the low-frequency signal differently. Here, the attenuation may mean an attenuation level or an attenuation band. That is, an attenuation time constant may be different among the respective additional-type attenuators 658. The additional-type attenuator selecting switch 660 selects part of the additional-type attenuators 658 within the plurality of additional-type attenuators 658. Specifically, the additional-type attenuator selecting switch 660 causes to bypass the other additional-type attenuators 658 except of the part of the additional-type attenuators 658. The receiver 662 receives the signal outputted out of the signal outputting circuit board 500 via the connector 652.

The measuring section 664 measures the attenuation level of the high-frequency signal in the transmission path from the signal outputting circuit board 500 to the receiver 662 when the signal outputting circuit board 500 for sending out the signal to be transmitted is connected with the signal receiving circuit board 650. For example, the measuring section 664 may measure the attenuation level of the high-frequency signal in the transmission path by measuring the signal level in the vicinity of the signal outputting circuit board 500 and in the vicinity of an input terminal of the receiver 662 in the transmission path from the signal outputting circuit board 500 to the receiver 662. It is noted that the measurement of the attenuation level by the measuring section 664 may be carried out in a step before transmitting the signal in the signal transfer system 60 and the measuring section 664 may be disconnected from the transmission path from the signal outputting circuit board 500 to the receiver 662 during when the signal is normally transmitted.

The switch control section 666 controls the ON/OFF states of the disconnecting switch 656 and the additional-type attenuator selecting switch 660 based on the measured result of the attenuation level of the high-frequency signal in the transmission path from the signal outputting circuit board 500 to the receiver 662 measured by the measuring section 664. Specifically, the switch control section 666 causes the disconnecting switch 656 to disconnect all of the additional-type attenuators 658 from the signal line 654 when the attenuation level measured by the measuring section 664 is smaller than a reference value set in advance. Further, the switch control section 666 causes the additional-type attenuator selecting switch 660 to select a part of the additional-type attenuators 658 within the plurality of additional-type attenuators 658 based on the attenuation level measured by the measuring section 664. Here, the switch control section 666 causes the additional-type attenuator selecting switch 660 to select the additional-type attenuators 658 in such a combination by which the difference of the attenuation level in the low and high frequency signals becomes fully small when the attenuation level of signal in the transmission lines including the signal lines in the signal outputting circuit board 500 and the signal receiving circuit board 650 and the cables connecting the signal outputting circuit board 500 with the signal receiving circuit board 650 and the attenuation level of signal by the selected additional-type attenuators 658 are summed up.

Thus, the signal transfer system 60 of the modification of the third embodiment of the invention allows the process of attenuating the low-frequency signal by desired level to be carried out at high precision by selecting the part of the additional-type attenuators 658 within the plurality of additional-type attenuators 658 whose attenuation level of low-frequency signal is different to attenuate the signal to be received. Accordingly, the signal transfer system 60 can always transmit the high-quality signal in which the difference of attenuation level of the high and low-frequency signals is fully small even when the factors that affect the attenuation level of the high-frequency signal such as length of the signal transmission path change depending on environments and others in which the signal outputting circuit board 500 and the signal receiving circuit board 650 are installed.

It is noted that the configuration of the signal transfer system 60 is not limited to that shown in the figure and various modifications may be added to the configuration shown in the figure. For example, the measuring section 664 may be provided on the outside of the signal receiving circuit board 650. It is apparently possible to control the disconnecting switch 656 and the additional-type attenuator selecting switch 660 based on the measured result of the measuring section 664 also in this case in the same manner as described above. Still more, the disconnecting switch 656, the plurality of additional-type attenuators 658, the additional-type attenuator selecting switch 660, the measuring section 664 and the switch control section 666 may be provided in the signal outputting circuit board 500, instead of the signal receiving circuit board 650. In this case, the disconnecting switch 656, the plurality of additional-type attenuators 658 and the additional-type attenuator selecting switch 660 may be provided between the driver 502 and the connector 504. Then, the disconnecting switch 656 and the additional-type attenuator selecting switch 660 are controlled in the signal outputting circuit board 500 based on the measured result of the attenuation level of the high and low-frequency signals in the transmission path from the driver 502 to the signal receiving circuit board 650 measured by the measuring section 664.

Figure 9:
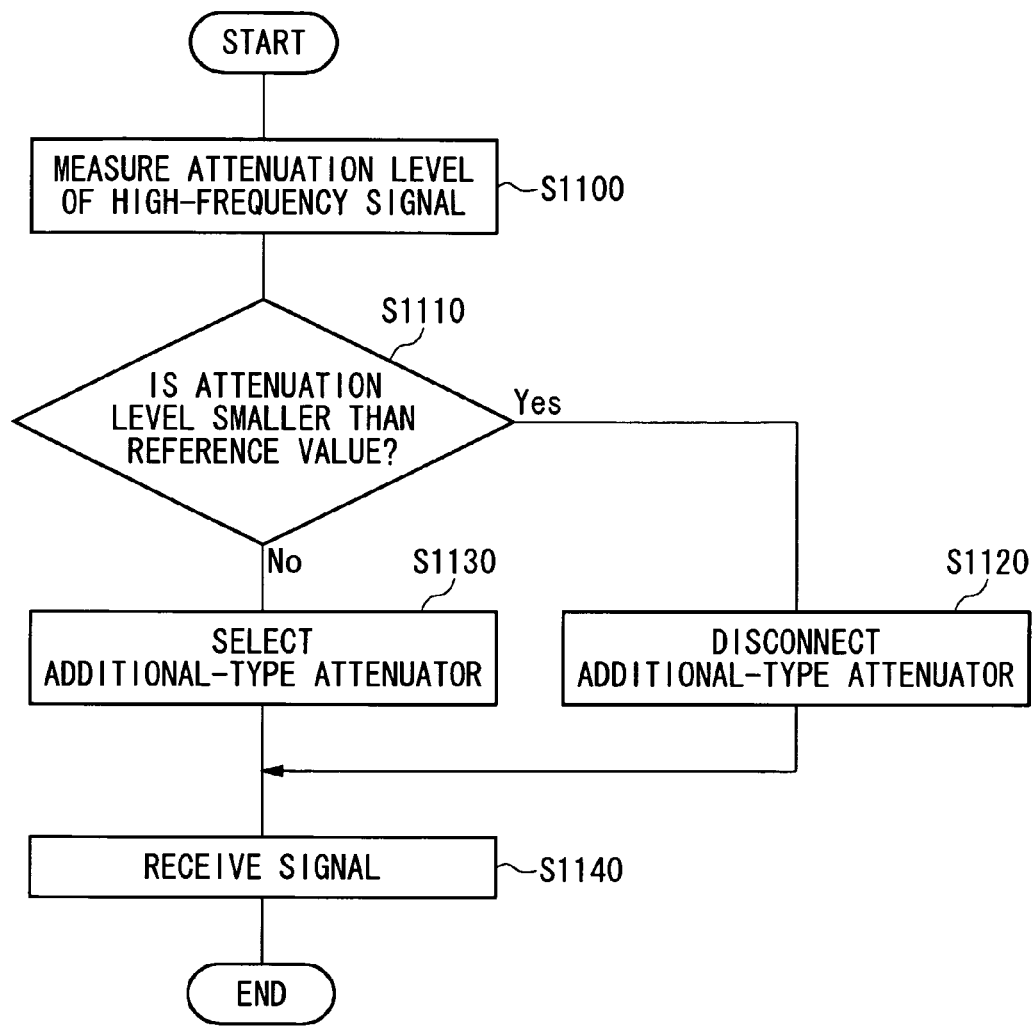
FIG. 9 is a flowchart showing one exemplary flow of processes in the signal transfer system according to the modification of the third embodiment of the invention.

FIG. 9 is a flowchart showing one exemplary flow of processes in the signal transfer system 60 according to the modification of the third embodiment of the invention. At first the measuring section 664 measures the attenuation level of the high-frequency signal in the transmission path from the signal outputting circuit board 500 to the receiver 662 in Step S1100. Then, the switch control section 666 judges whether or not the attenuation level measured by the measuring section 664 is smaller than the reference value set in advance in Step S1110. When the measured attenuation level is judged to be smaller than the reference value set in advance here (Yes in Step S1110), the switch control section 666 opens the disconnecting switch 656 and disconnects all of the additional-type attenuators 658 from the signal line 654 in Step S1120. When the measured attenuation level is judged to be not smaller than the reference value set in advance on the other hand (No in Step S1110), the switch control section 666 causes the additional-type attenuator selecting switch 660 to select the part of the additional-type attenuators 658 within the plurality of additional-type attenuators 658 to bypass the other additional-type attenuators 658 except of the selected part of the additional-type attenuators 658 in Step S1130. Then, the receiver 662 receives the signal outputted out of the signal outputting circuit board 500 via the connector 652 in Step SI 140.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the above description, the invention can realize the signal transfer system, the signal outputting circuit board, the signal receiving circuit board, the signal outputting method and the signal receiving method capable of matching the impedance in the transmission line while reducing the difference of attenuation level of the high and low-frequency signals.

What is claimed is:

1. A signal outputting circuit board for sending out a signal to the outside comprising:

a driver for outputting said signal;

a connector for sending out said signal to the outside;

an insertion-type attenuator, inserted between said driver and said connector in series, for largely attenuating the low-frequency signal more than a high-frequency signal;

a bypassing switch for bypassing said insertion-type attenuator;

a measuring section for measuring an attenuation level of the high-frequency signal in a transmission path from said driver to a signal receiving circuit board when said signal receiving circuit board that receives said signal is connected with said signal outputting circuit board via said connector; and a switch control section for turning on said bypassing switch when said attenuation level is smaller than a reference value.

2. The signal outputting circuit board as set forth in claim 1, wherein a plurality of insertion-type attenuators which attenuate a low-frequency signal differently is provided in parallel between said driver and said connector;

said signal outputting circuit board further comprises an insertion-type attenuator selecting switch for selecting part of said insertion-type attenuators within said plurality of insertion-type attenuators; and said switch control section causes said insertion-type attenuator selecting switch to select the part of insertion-type attenuators within said plurality of insertion-type attenuators based on the attenuation level measured by said measuring section.

3. A signal receiving circuit board for receiving a signal from the outside comprising:

a connector for receiving said signal from the outside;

a receiver for receiving said signal via said connector;

a signal line for transmitting said signal from said connector to said receiver;

an additional-type attenuator that connects said signal line with the reference potential and largely attenuates a low-frequency signal more than a high-frequency signal;

a disconnecting switch from disconnecting said additional-type attenuator;

a measuring section for measuring an attenuation level of the high-frequency signal in a transmission path from said signal outputting circuit board to said receiver when said signal outputting circuit board for sending out said signal is connected with said signal receiving circuit board via said connector; and a switch control section for disconnecting said additional-type attenuator by said disconnecting switch when said attenuation level is smaller than a reference value.

4. The signal receiving circuit board as set forth in claim 3, wherein a plurality of additional-type attenuators which attenuate a low-frequency signal differently is provided in series between said connector and said receiver;

said signal receiving circuit board further comprises an additional-type attenuator selecting switch for selecting part of said additional-type attenuators within said plurality of additional-type attenuators and bypassing the other additional-type attenuators; and said switch control section causes said additional-type attenuator selecting switch to select the part of said additional-type attenuators within said plurality of additional-type attenuators based on the attenuation level measured by said measuring section.

5. A signal outputting method for sending out a signal to the outside by using a signal outputting circuit board, comprising:

a step of outputting said signal by a driver;

a step of sending out said signal to the outside through a connector;

a step of attenuating a low-frequency signal more than a high-frequency signal by an insertion-type attenuator inserted between said driver and said connector in series;

a step of bypassing said insertion-type attenuator by a bypassing switch;

a step of measuring an attenuation level of the high-frequency signal in a transmission path from said driver to a signal receiving circuit board when said signal receiving circuit board that receives said signal is connected with said signal outputting circuit board via said connector; and a switch controlling step of turning on said bypassing switch when said attenuation level is smaller than a reference value.

6. The signal outputting method as set forth in claim 5, wherein a plurality of insertion-type attenuators which attenuate a low-frequency signal differently is provided in parallel between said driver and said connector in said signal outputting circuit board;

said signal outputting method further comprises a step of selecting a part of said insertion-type attenuators within said plurality of insertion-type attenuators by an insertion-type attenuator selecting switch; and said insertion-type attenuator selecting switch is caused to select the part of insertion-type attenuators within said plurality of insertion-type attenuators based on the attenuation level measured by said measuring step in said switch control step.

7. A signal receiving method for receiving a signal from the outside by using a signal receiving circuit board, comprising:

a step of receiving said signal from the outside through a connector;

a step of receiving said signal by a receiver via said connector;

a step of transmitting said signal from said connector to said receiver through a signal line;

an attenuating step of attenuating a low-frequency signal more than a high-frequency signal by an additional-type attenuator that connects said signal line with the reference potential;

a step of disconnecting said additional-type attenuator by a disconnecting switch;

a step of measuring an attenuation level of high-frequency signal in a transmission path from said signal outputting circuit board to said receiver when said signal outputting circuit board for sending out said signal is connected with said signal receiving circuit board via said connector; and a switch control step of disconnecting said additional-type attenuator by said disconnecting switch when said attenuation level is smaller than a reference value.

8. The signal receiving method as set forth in claim 7, wherein a plurality of additional-type attenuators which attenuate a low-frequency signal differently is provided in series between said connector an said receiver;

said signal receiving method further comprises a step of selecting a part of said additional-type attenuators within said plurality of additional-type attenuators by an additional-type attenuator selecting switch and bypassing the other additional-type attenuators; and said additional-type attenuator selecting switch is caused to select the part of said additional-type attenuators within said plurality of additional-type attenuators based on the attenuation level measured by said measuring section in said switch control step.

* * * * *